(12) United States Patent
Goodchild et al.

(10) Patent No.: US 11,171,502 B2
(45) Date of Patent: Nov. 9, 2021

(54) FREE POSITIONING CHARGING PAD

(71) Applicant: AIRA, INC., Chandler, AZ (US)

(72) Inventors: Eric Goodchild, San Tan Valley, AZ (US); Jake Slatnick, San Diego, CA (US)

(73) Assignee: AIRA, INC., Chandler, AZ (US)

( * ) Notice: Subject to any disclaimer, the term of this patent is extended or adjusted under 35 U.S.C. 154(b) by 215 days.

(21) Appl. No.: 16/283,734

(22) Filed: Feb. 22, 2019

(65) Prior Publication Data

US 2019/0267828 A1 Aug. 29, 2019

Related U.S. Application Data

(60) Provisional application No. 62/794,541, filed on Jan. 18, 2019, provisional application No. 62/784,667, filed on Dec. 24, 2018, provisional application No. 62/634,799, filed on Feb. 23, 2018.

(51) Int. Cl.

| | |
|---|---|
| *H02J 7/02* | (2016.01) |
| *H02J 7/00* | (2006.01) |
| *H02J 50/12* | (2016.01) |
| *H02J 50/80* | (2016.01) |
| *H02J 50/90* | (2016.01) |
| *H05K 1/14* | (2006.01) |
| *H05K 1/18* | (2006.01) |

(52) U.S. Cl.
CPC ............ *H02J 7/025* (2013.01); *H02J 7/0045* (2013.01); *H02J 50/12* (2016.02); *H02J 50/80* (2016.02); *H02J 50/90* (2016.02); *H05K 1/144* (2013.01); *H05K 1/181* (2013.01)

(58) Field of Classification Search
CPC .. H02J 7/025; H02J 7/0045; H02J 7/02; H02J 7/00; H02J 50/80; H02J 50/12; H02J 50/90; H05K 1/181; H05K 1/144; H05K 1/14; H05K 1/18
USPC ........................................................ 320/108
See application file for complete search history.

(56) References Cited

U.S. PATENT DOCUMENTS

| | | |
|---|---|---|
| 7,266,470 B1 | 9/2007 | Fulmer |
| 8,169,185 B2 | 5/2012 | Partovi et al. |
| 8,446,046 B2 | 5/2013 | Fells et al. |

(Continued)

OTHER PUBLICATIONS

PCT/US2019/109457. Int'l Search Report & Written Opinion (dated Jul. 18, 2019).

*Primary Examiner* — Richard Isla
*Assistant Examiner* — Dung V Bui
(74) *Attorney, Agent, or Firm* — Loza & Loza, LLP; Anthony Smyth

(57) ABSTRACT

Systems, methods and apparatus for wireless charging are disclosed. An apparatus has a wireless charging apparatus has a battery charging power source coupled to a charging circuit, a plurality of charging cells configured to provide a charging surface, and a controller. The controller may be configured to provide a pulse to the charging circuit, detect a frequency of oscillation of the charging circuit responsive to the pulse or a rate of decay of the oscillation of the charging circuit, and determine that a chargeable device has been placed in proximity to a coil of the charging circuit based on changes in a characteristic of the charging circuit. The pulse may have a duration that is less than half the period of a nominal resonant frequency of the charging circuit.

24 Claims, 23 Drawing Sheets

(56) References Cited

U.S. PATENT DOCUMENTS

| | | | |
|---|---|---|---|
| 8,531,153 B2* | 9/2013 | Baarman | H02J 5/005 |
| | | | 320/108 |
| 8,766,487 B2 | 7/2014 | Dibben et al. | |
| 9,106,083 B2 | 8/2015 | Partovi et al. | |
| 9,404,954 B2* | 8/2016 | Roy | B60L 53/65 |
| 9,722,447 B2 | 8/2017 | Partovi et al. | |
| 9,876,394 B1* | 1/2018 | Leabman | H02J 7/00712 |
| 9,939,539 B2 | 4/2018 | Oettinger | |
| 10,305,332 B2 | 5/2019 | Liu et al. | |
| 2007/0182367 A1 | 8/2007 | Partovi | |
| 2008/0116904 A1* | 5/2008 | Reynolds | G06F 3/04166 |
| | | | 324/678 |
| 2013/0176023 A1 | 7/2013 | Komiyama | |
| 2014/0062799 A1* | 3/2014 | Sutherland | H05K 13/00 |
| | | | 343/702 |
| 2014/0070624 A1* | 3/2014 | Kim | H02J 7/342 |
| | | | 307/104 |
| 2015/0008756 A1* | 1/2015 | Lee | H02J 7/00034 |
| | | | 307/104 |
| 2015/0044966 A1* | 2/2015 | Shultz | H04B 5/0031 |
| | | | 455/41.1 |
| 2015/0280442 A1 | 10/2015 | Graham | |
| 2015/0285926 A1* | 10/2015 | Oettinger | H02J 50/70 |
| | | | 307/104 |
| 2016/0043566 A1 | 2/2016 | Terao | |
| 2016/0329751 A1* | 11/2016 | Mach | H02J 50/20 |
| 2017/0033587 A1* | 2/2017 | Hong | H02J 50/80 |
| 2017/0150304 A1 | 5/2017 | Baldasare et al. | |
| 2017/0237296 A1* | 8/2017 | Keith | H02J 7/0042 |
| | | | 307/104 |
| 2017/0346344 A1* | 11/2017 | Uchimoto | H02J 50/12 |
| 2018/0109152 A1 | 4/2018 | Chen | |

* cited by examiner

FREE POSITIONING CHARGING PAD

PRIORITY CLAIM

This application claims priority to and the benefit of provisional patent application No. 62/634,799 filed in the United States Patent Office on Feb. 23, 2018, of provisional patent application No. 62/784,667 filed in the United States Patent Office on Dec. 24, 2018, and of provisional patent application No. 62/794,541 filed in the United States Patent Office on Jan. 18, 2019, the entire content of which applications are incorporated herein by reference as if fully set forth below in their entirety and for all applicable purposes.

TECHNICAL FIELD

The present invention relates generally to wireless charging of batteries, including batteries in mobile computing devices.

BACKGROUND

Wireless charging systems have been deployed to enable certain types of devices to charge internal batteries without the use of a physical charging connection. Devices that can take advantage of wireless charging include mobile processing and/or communication devices. Standards, such as the Qi standard defined by the Wireless Power Consortium enable devices manufactured by a first supplier to be wirelessly charged using a charger manufactured by a second supplier. Standards for wireless charging are optimized for relatively simple configurations of devices and tend to provide basic charging capabilities.

Conventional wireless charging systems typically use a "Ping" to determine if a receiving device is present on or proximate to a transmitting coil in a base station for wireless charging. The transmitter coil has an inductance (L) and, a resonant capacitor that has a capacitance (C) is coupled to the transmitting coil to obtain a resonant LC circuit. A Ping is produced by delivering power to the resonant LC circuit. Power is applied for a duration of time (90 ms in one example) while the transmitter listens for a response from a receiving device. The response may be provided in a signal encoded using Amplitude Shift Key (ASK) modulation. This conventional Ping-based approach can be slow due to the 90 ms duration, and can dissipate large and significant amount of energy, which may amount to 80 mJ per Ping. In one example, a typical transmitting base station may ping as fast as 12.5 times a second (period=1/80 ms) with a power consumption of (80 mJ*12.5) per second=1 W. In practice most, designs trade off responsiveness for a lower quiescent power draw by lowering the ping rate. As an example, a transmitter may ping 5 times a second with a resultant power draw of 400 mW.

Tradeoffs are generally possible for base stations that employ a single transmitting coil, because a ping rate of 5 times a second is usually sufficient to detect a device within 1 second of its placement on a charging pad. However, for a multi-coil free position charging pad, responsiveness and quiescent power draw characteristics may be impaired. For example, 35 pings per second would be required to produce 5 pings per second on each transmitting coil of a 7-coil, free position charging pad scanning. Given the power limits defined by design specifications, the 7-coil, a free position charging pad has a response rate that is greater than 1.78 seconds, which is typically unacceptable for user experience and may violate regulatory power standards or power budgets for battery powered designs.

Improvements in wireless charging capabilities are required to support continually increasing complexity of mobile devices and changing form factors. For example, there is a need for a faster, lower power detection techniques.

SUMMARY

Certain aspects disclosed herein relate to improved wireless charging techniques. In one aspect of the disclosure, a method for detecting an object includes providing a pulse to a charging circuit, detecting a frequency of oscillation of the charging circuit responsive to the pulse or a rate of decay of the oscillation of the charging circuit, and determining that a chargeable device has been placed in proximity to a coil of the charging circuit based on changes in a characteristic of the charging circuit. The pulse may have a duration that is less than half the period of a nominal resonant frequency of the charging circuit.

In certain aspects, the change in the characteristic of the charging circuit causes a change in rate of decay of the oscillation of the charging circuit. The change in the characteristic of the charging circuit may cause the frequency of oscillation of the charging circuit to vary with respect to the resonant frequency of the charging circuit.

In certain aspects, the method includes determining a charging configuration for the chargeable device when the coil of the charging circuit is inductively coupled to a receiving coil in the chargeable device, and providing a charging current to the charging circuit in accordance with the charging configuration. Determining the charging configuration for the chargeable device may include selecting a baseline charging configuration as the charging configuration. Determining the charging configuration for the chargeable device may include transmitting an active ping in accordance with standards-defined specifications for charging the chargeable device, and identifying the chargeable device from information encoded in a modulated signal received from the chargeable device. Determining the charging configuration for the chargeable device may include negotiating the charging configuration with the chargeable device to provide an extended power profile used while charging the chargeable device.

In one aspect, the method includes conducting a low-power search of a plurality of charging coils to determine if an electrical, mechanical or magnetic characteristic of at least one charging coil has been affected by an object placed in proximity to the at least one charging coil, and configuring the charging circuit to include the at least one charging coil.

In one aspect, the method includes detecting that a change in capacitance associated with at least one charging coil is indicative of an object placed in proximity to the at least one charging coil, and configuring the charging circuit to include the at least one charging coil.

In one aspect of the disclosure, a wireless charging apparatus has a battery charging power source coupled to a charging circuit, a plurality of charging cells configured to provide a charging surface, and a controller. The controller may be configured to provide a pulse to the charging circuit, detect a frequency of oscillation of the charging circuit responsive to the pulse or a rate of decay of the oscillation of the charging circuit, and determine that a chargeable device has been placed in proximity to a coil of the charging circuit based on changes in a characteristic of the charging circuit. The pulse may have a duration that is less than half the period of a nominal resonant frequency of the charging circuit.

DETAILED DESCRIPTION

Figure 1:
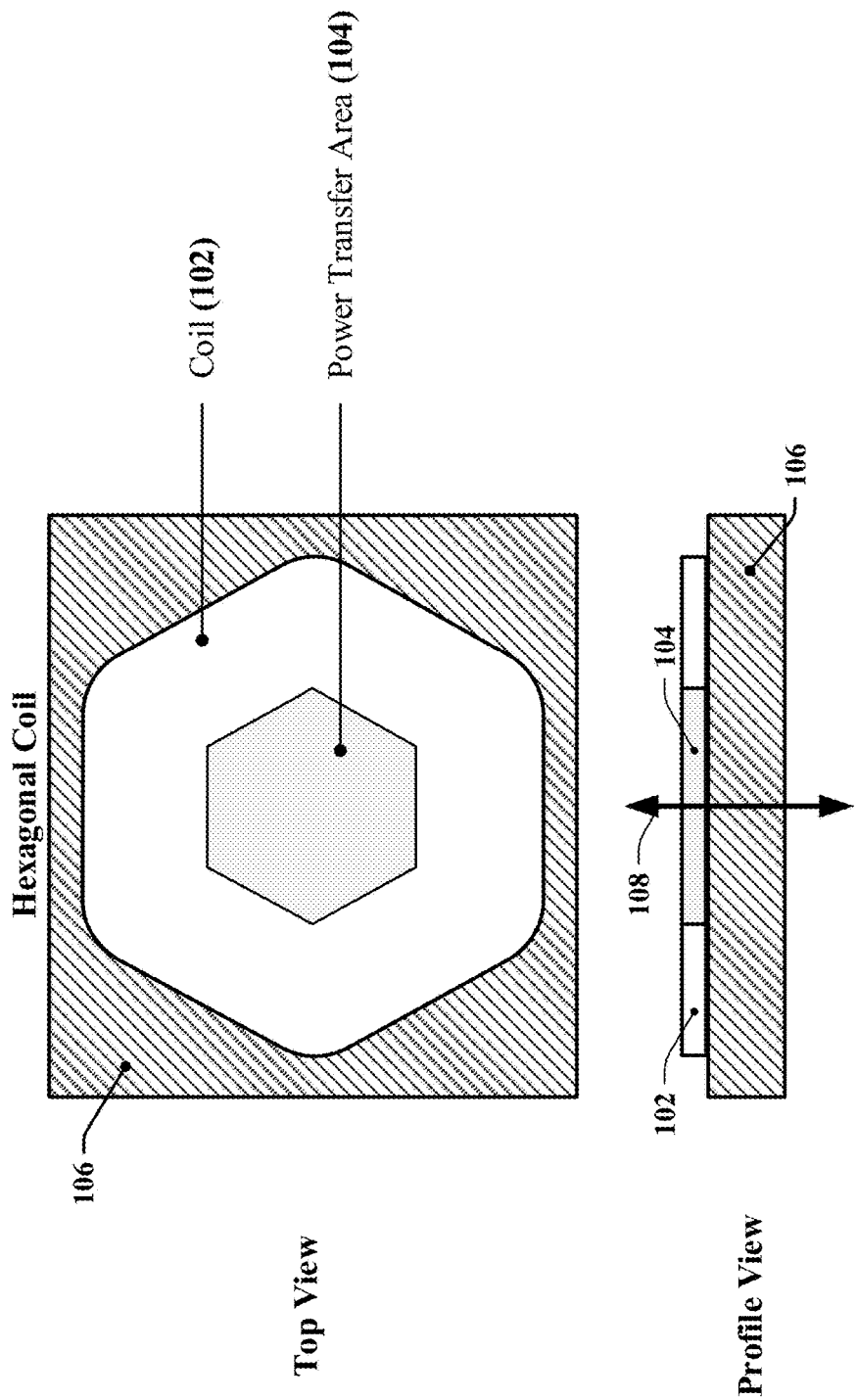
FIG. 1 illustrates an example of a charging cell that may be employed to provide a charging surface in accordance with certain aspects disclosed herein.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of wireless charging systems will now be presented with reference to various apparatus and methods. These apparatus and methods will be described in the following detailed description and illustrated in the accompanying drawing by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a processor-readable storage medium. A processor-readable storage medium, which may also be referred to herein as a computer-readable medium may include, by way of example, a magnetic storage device (e.g., hard disk, floppy disk, magnetic strip), an optical disk (e.g., compact disk (CD), digital versatile disk (DVD)), a smart card, a flash memory device (e.g., card, stick, key drive), Near Field Communications (NFC) token, random access memory (RAM), read only memory (ROM), programmable ROM (PROM), erasable PROM (EPROM), electrically erasable PROM (EEPROM), a register, a removable disk, a carrier wave, a transmission line, and any other suitable medium for storing or transmitting software. The computer-readable medium may be resident in the processing system, external to the processing system, or distributed across multiple entities including the processing system. Computer-readable medium may be embodied in a computer-program product. By way of example, a computer-program product may include a computer-readable medium in packaging materials. Those skilled in the art will recognize how best to implement the described functionality presented throughout this disclosure depending on the particular application and the overall design constraints imposed on the overall system.

Overview

Certain aspects of the present disclosure relate to systems, apparatus and methods applicable to wireless charging devices and techniques. Charging cells may be configured with one or more inductive coils to provide a charging surface that can charge one or more devices wirelessly. The location of a device to be charged may be detected through sensing techniques that associate location of a device to changes in a physical characteristic centered at a known location on the charging surface. Sensing of location may be implemented using capacitive, resistive, inductive, touch, pressure, load, strain, and/or another appropriate type of sensing.

In one aspect of the disclosure, an apparatus has a battery charging power source, a plurality of charging cells configured in a matrix, a first plurality of switches in which each switch is configured to couple a row of coils in the matrix to a first terminal of the battery charging power source, and a second plurality of switches in which each switch is configured to couple a column of coils in the matrix to a second terminal of the battery charging power source. Each charging cell in the plurality of charging cells may include one or more coils surrounding a power transfer area. The plurality of charging cells may be arranged adjacent to a charging surface without overlap of power transfer areas of the charging cells in the plurality of charging cells.

Certain aspects of the present disclosure relate to systems, apparatus and methods for wireless charging using stacked coils that can charge target devices presented to a charging device without a requirement to match a particular geometry or location within a charging surface of the charging device. Each coil may have a shape that is substantially polygonal. In one example, each coil may have a hexagonal shape. Each coil may be implemented using wires, printed circuit board traces and/or other connectors that are provided in a spiral. Each coil may span two or more layers separated by an insulator or substrate such that coils in different layers are centered around a common axis.

According to certain aspects disclosed herein, power can be wirelessly transferred to a receiving device located anywhere on a charging surface that can have an arbitrarily defined size and/or shape without regard to any discrete placement locations enabled for charging. Multiple devices can be simultaneously charged on a single charging surface. The charging surface may be manufactured using printed circuit board technology, at low cost and/or with a compact design.

Another aspect of the present disclosure relates to systems, apparatus and methods that enable fast, low-power detection of objects placed in proximity to a charging surface. In one example, an object may be detected when a pulse provided to a charging circuit stimulates an oscillation in the charging circuit, or in some portion thereof. A frequency of oscillation of the charging circuit responsive to the pulse or a rate of decay of the oscillation of the charging circuit may be indicative or determinative of presence of a chargeable device has been placed in proximity to a coil of the charging circuit. Identification of a type or nature of the object may be made based on changes in a characteristic of the charging circuit. The pulse provided to the charging circuit may have a duration that is less than half the period of a nominal resonant frequency of the charging circuit.

Charging Cells

According to certain aspects disclosed herein, a charging surface may be provided using charging cells that are deployed adjacent to the charging surface. In one example the charging cells are deployed in accordance with a honeycomb packaging configuration. A charging cell may be implemented using one or more coils that can each induce a magnetic field along an axis that is substantially orthogonal to the charging surface adjacent to the coil. In this description, a charging cell may refer to an element having one or more coils where each coil is configured to produce an electromagnetic field that is additive with respect to the fields produced by other coils in the charging cell, and directed along or proximate to a common axis.

In some implementations, a charging cell includes coils that are stacked along a common axis and/or that overlap such that they contribute to an induced magnetic field substantially orthogonal to the charging surface. In some implementations, a charging cell includes coils that are arranged within a defined portion of the charging surface and that contribute to an induced magnetic field within the substantially orthogonal to portion of the charging surface associated with the charging cell. In some implementations, charging cells may be configurable by providing an activating current to coils that are included in a dynamically-defined charging cell. For example, a charging device may include multiple stacks of coils deployed across a charging surface, and the charging device may detect the location of a device to be charged and may select some combination of stacks of coils to provide a charging cell adjacent to the device to be charged. In some instances, a charging cell may include, or be characterized as a single coil. However, it should be appreciated that a charging cell may include multiple stacked coils and/or multiple adjacent coils or stacks of coils.

FIG. 1 illustrates an example of a charging cell 100 that may be deployed and/or configured to provide a charging surface. In this example, the charging cell 100 has a substantially hexagonal shape that encloses one or more coils 102 constructed using conductors, wires or circuit board traces that can receive a current sufficient to produce an electromagnetic field in a power transfer area 104. In various implementations, some coils 102 may have a shape that is substantially polygonal, including the hexagonal charging cell 100 illustrated in FIG. 1. Other implementations may provide coils 102 that have other shapes. The shape of the coils 102 may be determined at least in part by the capabilities or limitations of fabrication technology, and/or to optimize layout of the charging cells on a substrate 106 such as a printed circuit board substrate. Each coil 102 may be implemented using wires, printed circuit board traces and/or other connectors in a spiral configuration. Each charging cell 100 may span two or more layers separated by an insulator or substrate 106 such that coils 102 in different layers are centered around a common axis 108.

Figure 2:
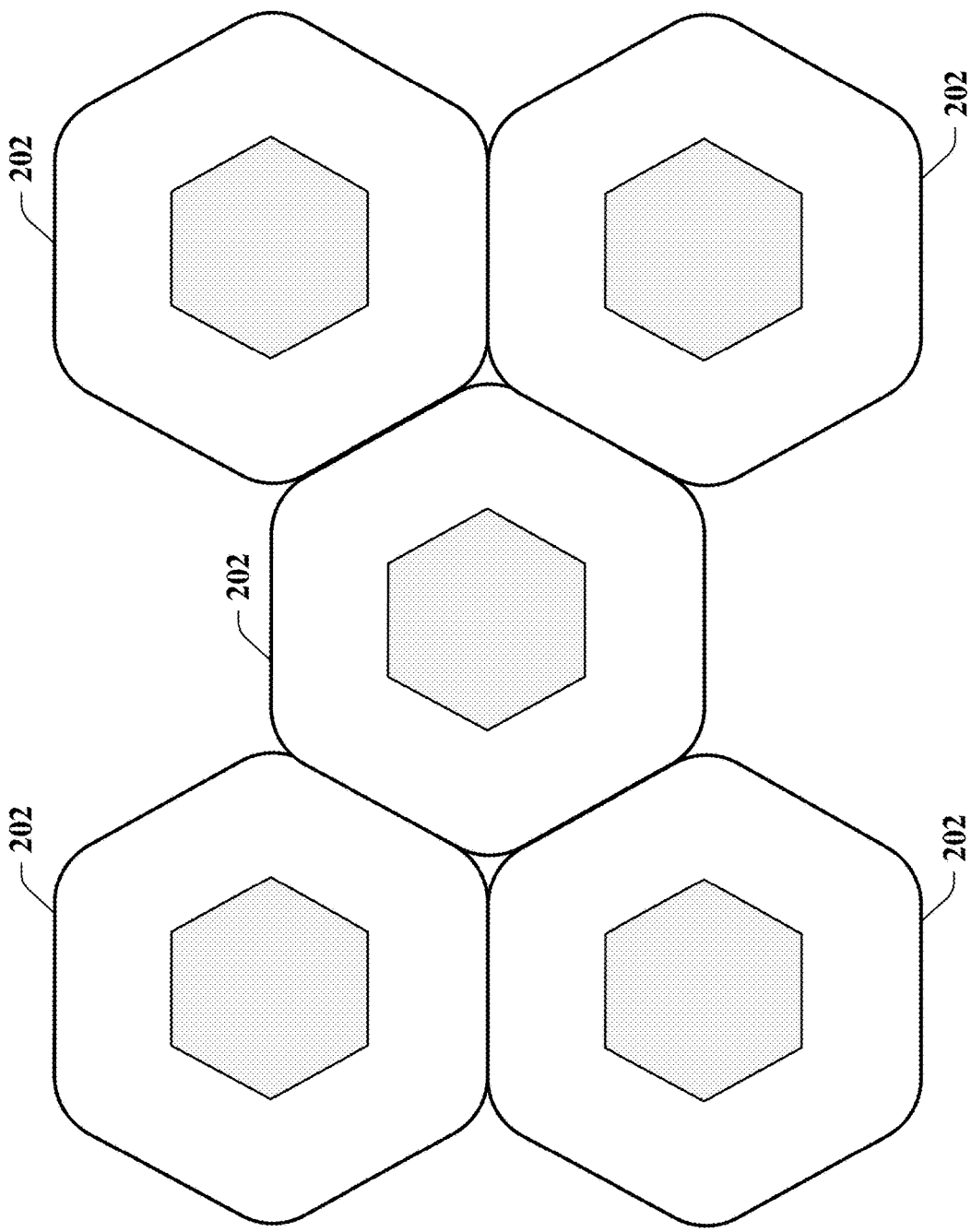
FIG. 2 illustrates an example of an arrangement of charging cells provided on a single layer of a segment of a charging surface that may be adapted in accordance with certain aspects disclosed herein.

FIG. 2 illustrates an example of an arrangement 200 of charging cells 202 provided on a single layer of a segment of a charging surface that may be adapted in accordance with certain aspects disclosed herein. The charging cells 202 are arranged according to a honeycomb packaging configuration. In this example, the charging cells 202 are arranged end-to-end without overlap. This arrangement can be provided without through-hole or wire interconnects. Other arrangements are possible, including arrangements in which some portion of the charging cells 202 overlap. For example, wires of two or more coils may be interleaved to some extent.

Figure 3:
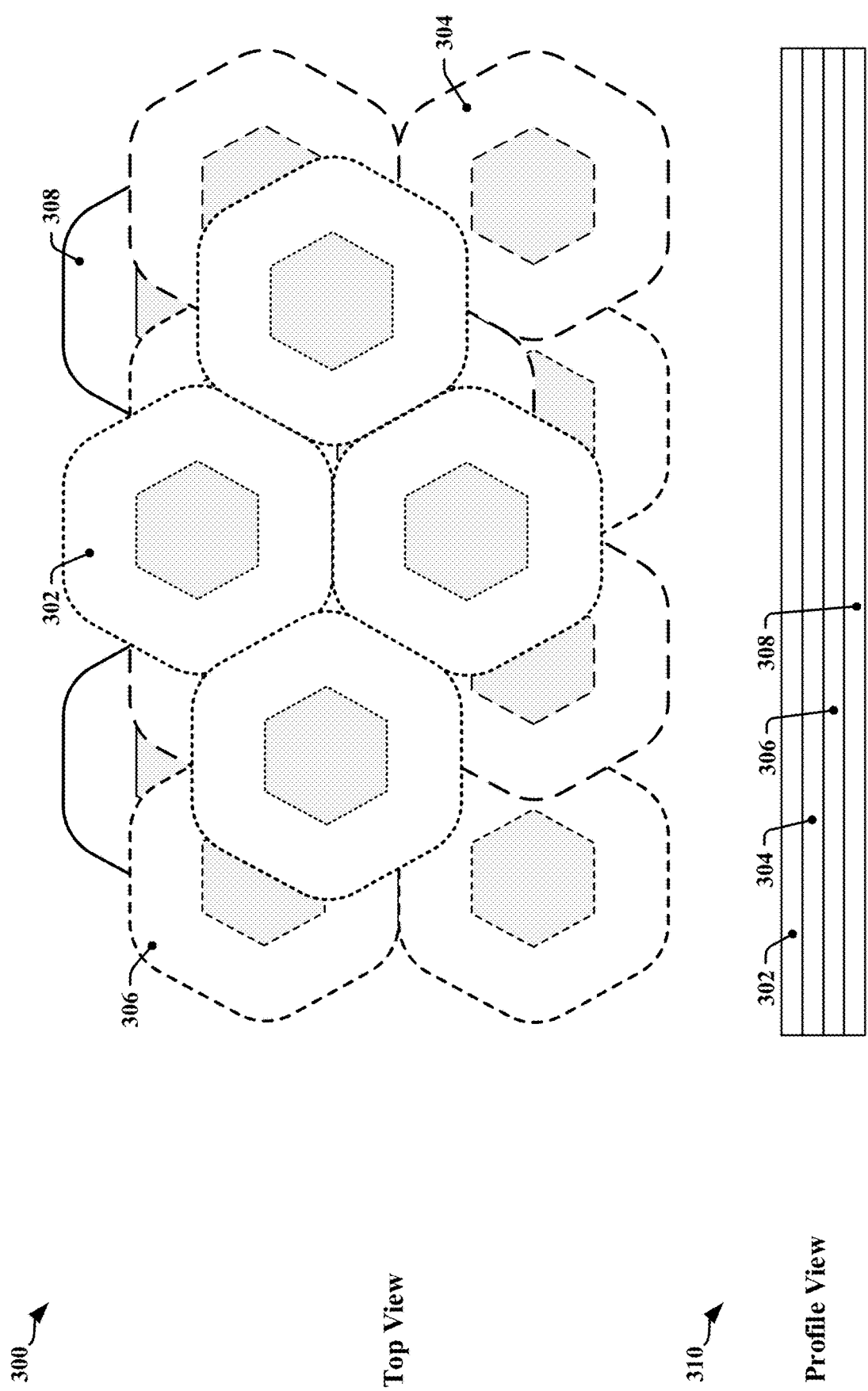
FIG. 3 illustrates an example of an arrangement of charging cells when multiple layers are overlaid within a segment of a charging surface that may be adapted in accordance with certain aspects disclosed herein.

FIG. 3 illustrates an example of an arrangement of charging cells from two perspectives 300, 310 when multiple layers are overlaid within a segment of a charging surface that may be adapted in accordance with certain aspects disclosed herein. Layers of charging cells 302, 304, 306, 308 provided within a segment of a charging surface. The charging cells within each layer of charging cells 302, 304, 306, 308 are arranged according to a honeycomb packaging configuration. In one example, the layers of charging cells 302, 304, 306, 308 may be formed on a printed circuit board that has four or more layers. The arrangement of charging cells 100 can be selected to provide complete coverage of a designated charging area that is adjacent to the illustrated segment.

Figure 4:
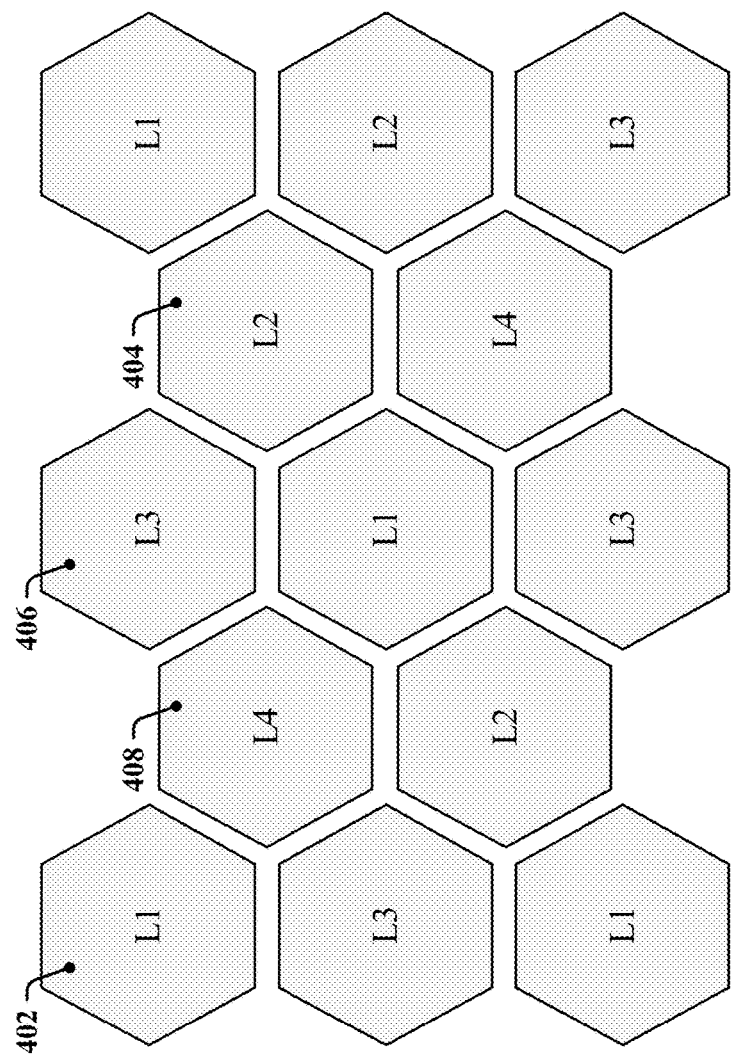
FIG. 4 illustrates the arrangement of power transfer areas provided by a charging surface that employs multiple layers of charging cells configured in accordance with certain aspects disclosed herein.

FIG. 4 illustrates the arrangement of power transfer areas provided in a charging surface 400 that employs multiple layers of charging cells configured in accordance with certain aspects disclosed herein. The illustrated charging surface is constructed from four layers of charging cells 402, 404, 406, 408. In FIG. 4, each power transfer area provided by a charging cell in the first layer of charging cells 402 is marked "L1", each power transfer area provided by a charging cell in the second layer of charging cells 404 is marked "L2", each power transfer area provided by a charging cell in the third layer of charging cells 406 is marked "L3", and each power transfer area provided by a charging cell in the fourth layer of charging cells 408 is marked "L4".

Locating Devices on a Charging Surface

In accordance with certain aspects disclosed herein, location sensing may rely on changes in some property of the electrical conductors that form coils in a charging cell. Measurable differences in properties of the electrical conductors may include capacitance, resistance, inductance and/or temperature. In some examples, loading of the charging surface can affect the measurable resistance of a coil located near the point of loading. In some implementations, sensors may be provided to enable location sensing through detection of changes in touch, pressure, load and/or strain.

Figure 5:
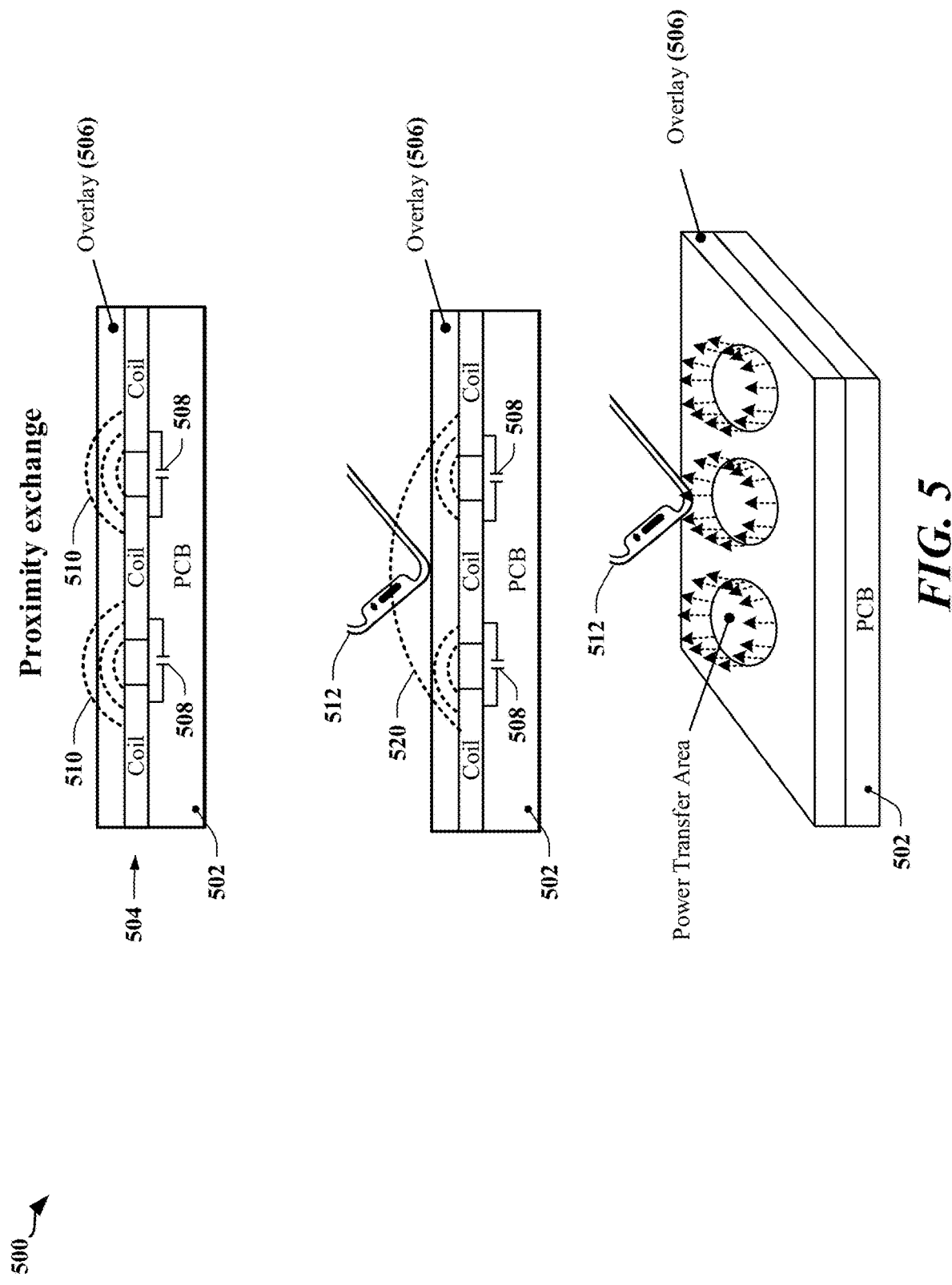
FIG. 5 illustrates the use of differential capacitive sensing to detect location and/or orientation of a mobile communication device in accordance with certain aspects disclosed herein.

Certain aspects disclosed herein provide apparatus and methods that can sense the location of low-power devices that may be freely placed on a charging surface using differential capacitive sense techniques. FIG. 5 illustrates an example 500 of the use of differential capacitive sense to detect location and/or orientation of a mobile communication device or other object 512. One or more coils 504 are provided on a surface of a printed circuit board 502, substrate or other type of carrier. Capacitive coupling (illustrated by the dashed lines 510) can be attributed to an effective capacitance 508 be measurable between pairs of the coils 504. Capacitance may be measured using a circuit coupled to each of the coils 504. An object 512, such as a chargeable device can increase or decrease the apparent capacitance 508 between the pairs of the coils 504. The object 512 may modify the capacitive coupling (illustrated by the dashed lines 520) between the pairs of the coils 504. In one example, the object 512 may affect the dielectric properties of an overlay 506, provide an alternative capacitive circuit through the object 512 and/or produce some other change in electrical characteristic that increases or decreases the measured or apparent value of the capacitance 508 between the pairs of the coils 504. The measured difference caused by the object 512 may be referred to as differential capacitance.

A charging device can use differential capacitive sensing to locate devices anywhere on charging surface that includes a coil array provided according to certain aspects disclosed herein. The charging device may then determine one or more of the coils 504 that can be used to provide optimal charging of the device, which may be referred to as a receiving device.

The use of differential capacitive sensing enables an extremely low-power detection and location operation in comparison to conventional detection techniques. Conventional techniques used in current wireless charging applications for detecting devices employ "ping" methods that drive the transmitting coil and consume substantial power (e.g., 100-200 mW). The field generated by the transmitting coil is used to detect a receiving device. Differential capacitive sensing does not require powering the transmitting coil to detect presence of a receiving device and requires no additional sensing elements. The coils used in the coil array can serve as the capacitive sense elements used to find a receiving device and/or to identify physical location of the receiving device.

Differential capacitive sensing operates by measuring the differential capacitance between two adjacent coils. Differences and/or changes in capacitance can identify presence of the receiving device, without the need for a ground plane or additional conductive sense elements. Differential capacitive sensing provides a high-speed methodology that enables rapid detection of receiving devices by eliminating the need to wait for a response transmitted by a receiving device in response to a ping. Differential capacitive sensing can also sense receiving devices that have insufficient stored power to respond to a ping or query from the charging device.

According to certain aspects, presence, position and/or orientation of a receiving device may be determined using differential capacitive sensing or another location sensing technique that involves, for example, detecting differences or changes in capacitance, resistance, inductance, touch, pressure, temperature, load, strain, and/or another appropriate type of sensing. Location sensing may be employed to determine an approximate location of the device to be charged and enable a charging device to determine if a compatible device has been placed on the charging surface. For example, the charging device may determine that a compatible device has been placed on the charging surface by sending an intermittent test signal (ping) that causes a compatible device to respond. The charging device may be configured to activate one or more coils in at least one charging cell after determining receiving a response signal defined by standard, convention, manufacturer or application. In some examples, the compatible device can respond to a ping by communicating received signal strength such that the charging device can find an optimal charging cell to be used for charging the compatible device.

In one example, a controller, state machine or other processing device may be configured to measure a capacitance attributable to one or more coils in a charging cell, and to determine whether the measured capacitance indicates proximity of a receiving device or corresponding coil in a receiving device. In some instances, the capacitance may be measured as a difference in capacitance in a sensing circuit.

The controller, state machine or other processing device may maintain information that identifies expected capacitance associated with each charging cell when no receiving device is present. Differences in measured capacitance may then be used to determine that a receiving device is located near the charging cell. The size of the difference may be indicative of the distance between charging cell and the receiving device.

In some implementations, the controller, state machine or other processing device may maintain one or more profiles of the charging surface. The profiles may relate individual or groups of charging cells to expected capacitance measurements, last measured capacitances and/or historical likelihoods of capacitance values when a receiving device is present.

According to certain aspects, presence, position and/or orientation of a receiving device may be determined by searching the charging cells for differences in capacitance using a search pattern. The search pattern may be pseudorandom to improve average time to detect a charging device. In some implementations, the starting point of the search may be selected based on a history of measurements captured when a receiving device was in proximity and receiving charge. In some implementations, an initial group of charging cells may be prioritized for searching based on a history of measurements captured when a receiving device was in proximity and receiving charge.

Figure 6:
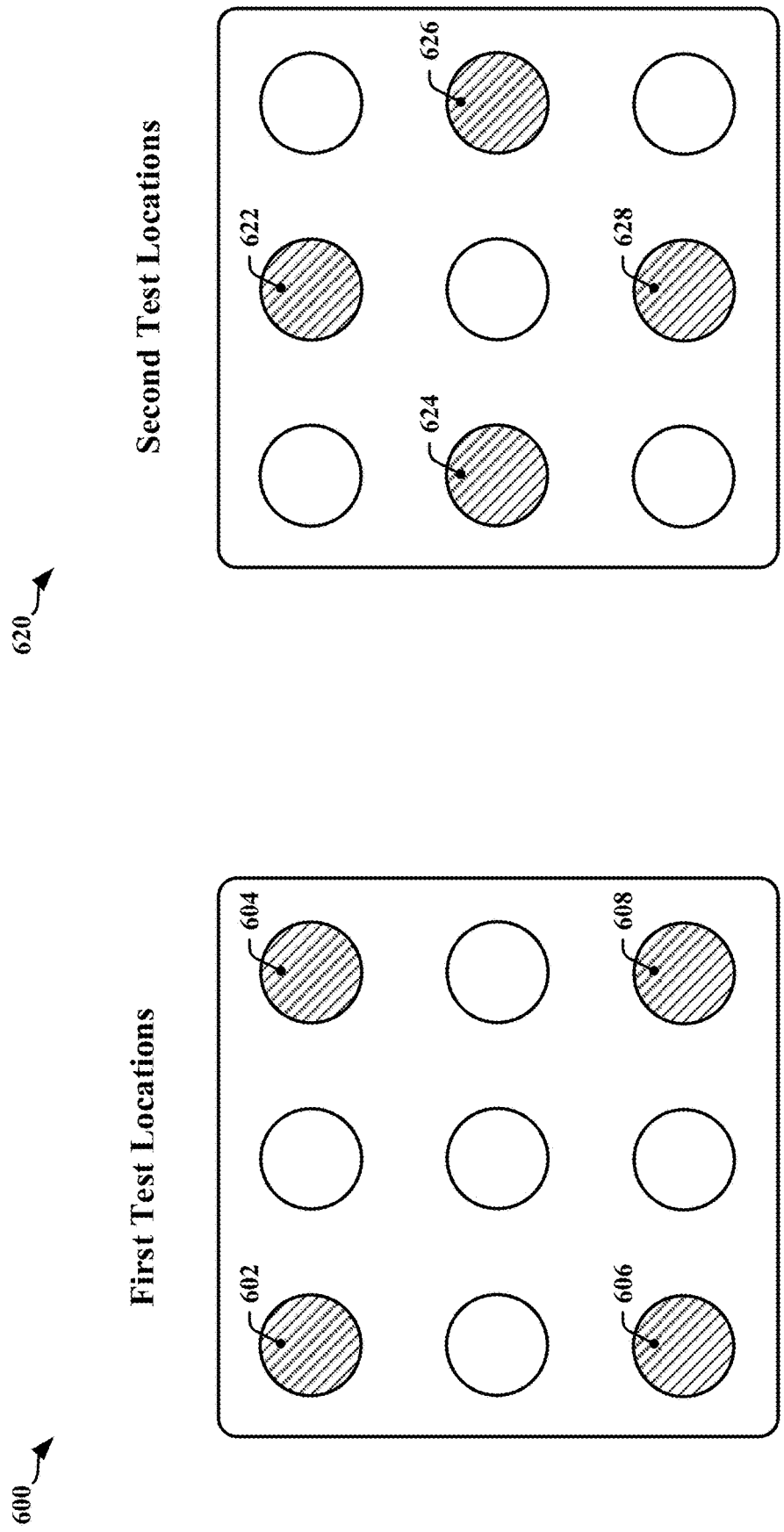
FIG. 6 illustrates certain aspects of a search conducted when each charging cell includes multiple coils in accordance with certain aspects disclosed herein.

FIG. 6 illustrates certain aspects of a search conducted in a grouping of coils that includes multiple coils 602, 604, 606, 608, 622, 624, 626, 628. In some implementations, a search may be conducted by measuring differences in measurable properties of different groupings of coils 600, 620. In the illustrated example, a combined property of a first grouping of coils 600 that includes coils 602, 604, 606, 608 may be assessed independently of the combined property of a second grouping of coils 620 that includes coils 622, 624, 626, 628. The groupings of coils 600, 620 may be selected to increase the quantity to be measured through aggregation, or to cover a wider area during a single measurement. In one example, the capacitance associated with a stack of coils may be measured as an aggregate. In another example, the capacitance of coils at different locations in a charging surface may be measured to enable rapid detection of a device to be charged that is placed on the charging surface serviced by the measured coils.

Figure 7:
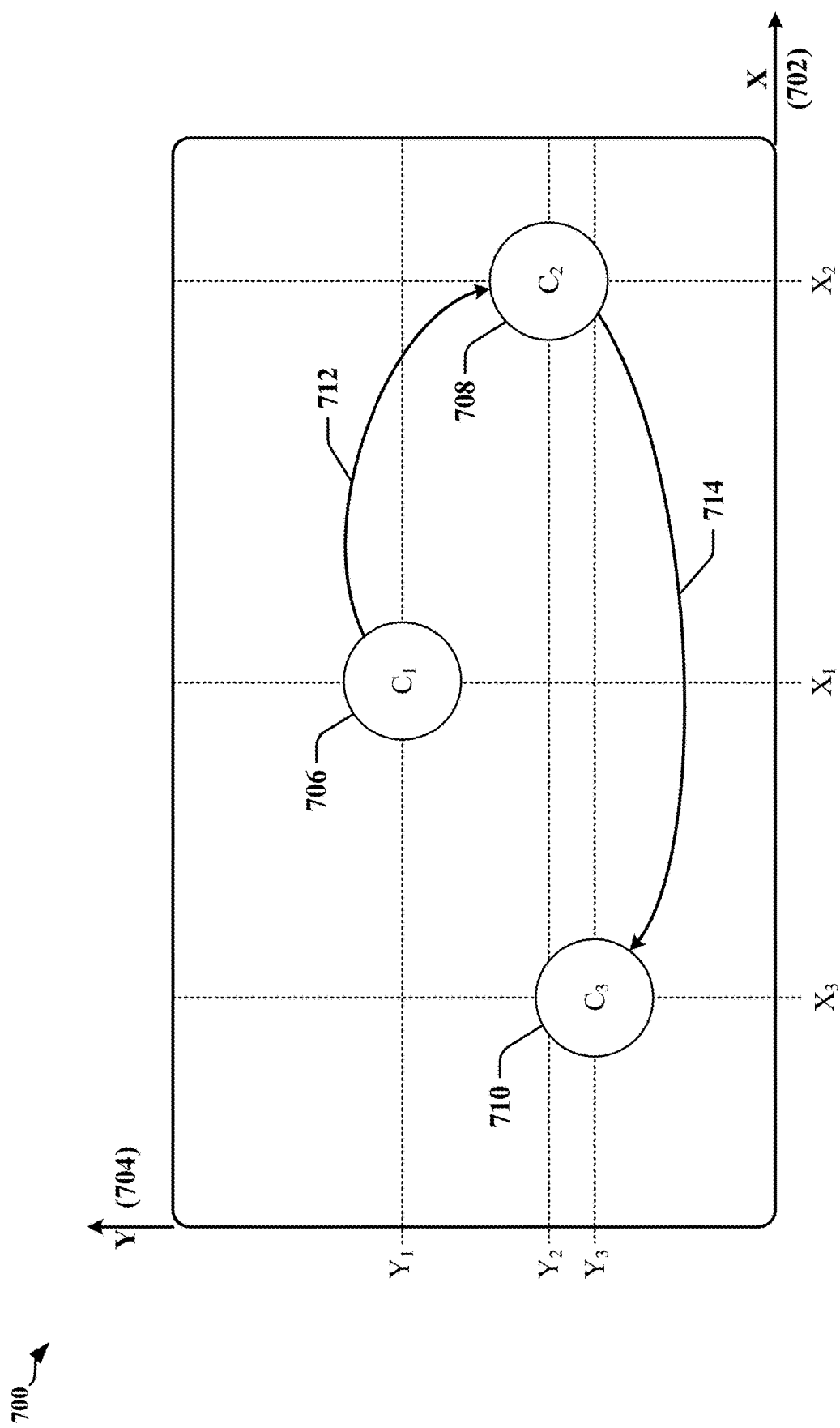
FIG. 7 illustrates a charging surface with multiple charging cells, including the three illustrated charging cells involved in a search conducted in accordance with certain aspects disclosed herein.
Figure 8:
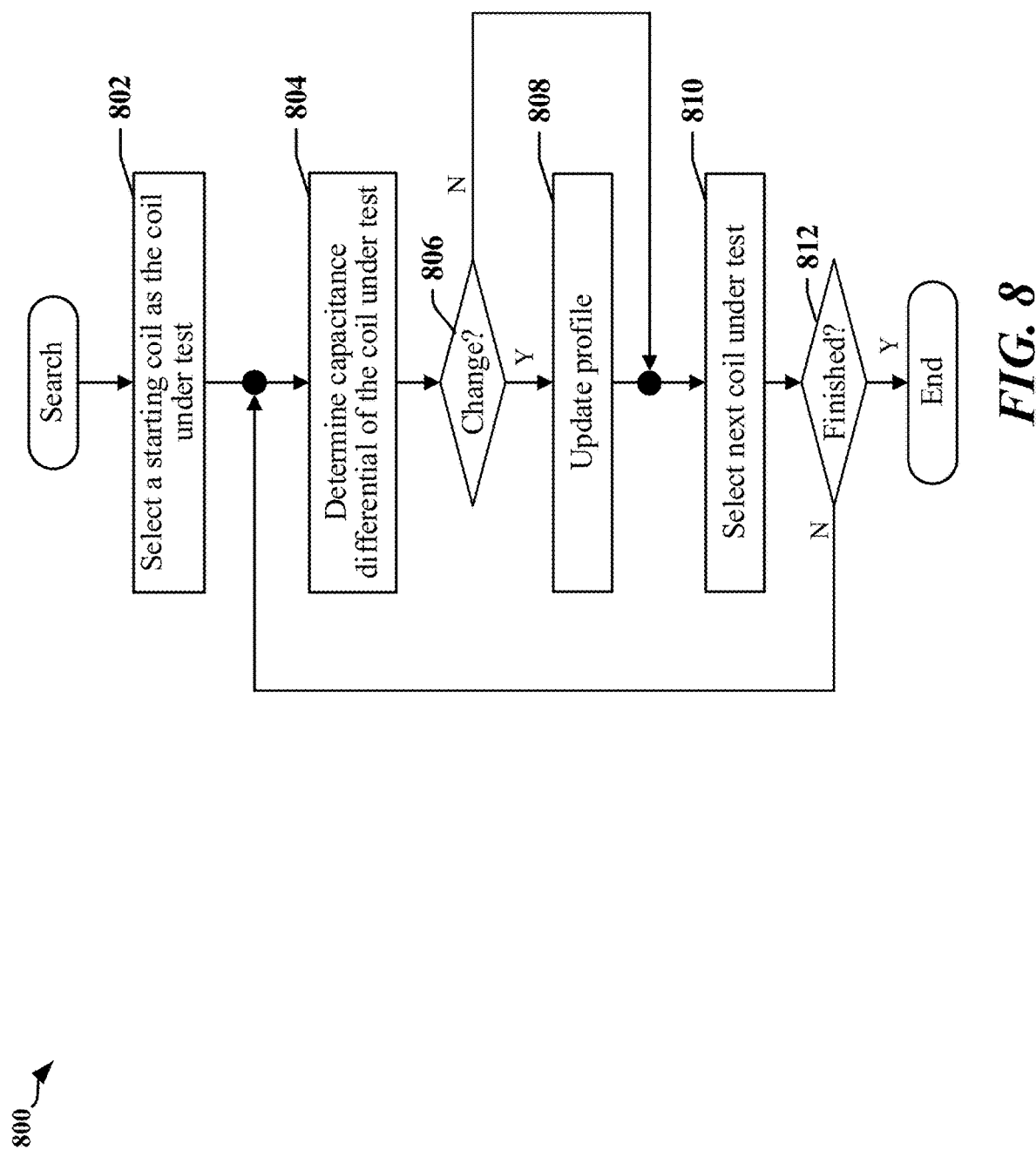
FIG. 8 is a flowchart illustrating a search process that may be conducted by a charging device in accordance with certain aspects disclosed herein.

FIGS. 7 and 8 illustrate certain aspects of a search conducted using differential capacitive sensing. FIG. 7 illustrates a two-dimensional view (X axis 702 and Y axis 704) of a charging surface 700, which is provided with one or more charging cells that include the three illustrated charging coils 706, 708, 710. Certain aspects illustrated by FIG. 7 are also applicable to searches involving individual coils within a charging coils 706, 708, 710 or spread throughout a charging surface 700 and/or in a three-dimensional space. In the illustrated example, the charging coils 706, 708, 710 are the first three charging coils tested during a search, which may be conducted as a pseudorandom search. The search commences at a first charging coil 706. The search pattern may cause testing to move 712 to a second charging coil 708, and may then cause testing to move 714 to a third charging coil 710. The search may be conducted to identify the general location of a receiving device and may be stopped when a measurement indicating presence of a receiving device is obtained. A second, area-specific search may then be conducted around the charging coil 706, 708, 710.

FIG. 8 is a flowchart 800 illustrating a search process that may be conducted by a charging device to determine if, or where, a device to be charged has been placed on a charging surface. The flowchart 800 may relate to individual coils provided within a charging device, to groups of coils stacked in proximity along a common axis, and/or groups of coils provided in a single charging coil 706, 708, 710 or servicing an area of interest of the charging surface (see also FIG. 6).

At block 802, an initial coil or group of coils is selected as a starting for the search. The starting point may be selected using a pseudorandom number generator, or the like. In some instances, the starting point may be selected from a group of potential starting points that may be known or expected to be near locations that have a higher probability that a device to be charged to be present. For example, a charging device may maintain a history of searches and/or charging events that identify the location of a device that was charged and/or the charging coils or charging cells that are most frequently activated to charge devices.

At block 804, the charging device may obtain measurements of capacitance of conductors in one or more coils, or some other property associated with the coils or charging surface that may be altered in the presence of a device to be charged. The charging device may determine if the value measured property has changed from a previously measured value of the property, a nominal value, and/or values measured at a different site on the charging surface.

If a change is detected at block 804, the charging device may update a profile of the charging surface at block 808. For example, the profile may be modified to reflect the new value and/or the size of the change in the value. The profile may be used to map the potential location of a device to be charged and/or to remap or unmap devices that have been moved or removed from the charging surface. In some instances, the detection of a change or difference in the measured property may cause the charging device to initiate a ping using a charging coil that exhibited a change or triggering property value. If no change was detected at block 806, or no charging process initiated at block 808, the search may continue at block 810.

At block 810, the charging device may select a next coil to be measured. The selection may be made based on a pseudorandom sequence, using a pseudorandom number generator to select a next coil. If at block 812 it is determined that all coils to be tested have been tested, the search may be terminated. If additional coils remain to be tested, the search may continue at block 804.

When a search identifies a potential device placement on the charging surface, the charging device may begin a ping procedure to identify a charging cell, a combination of charging cells and/or a combination of coils that are to be activated to charge the device placed on the charging surface. The ping procedure verifies that the device to be charged is compatible with the charging device, and may identify a signal strength indicating whether the coils used to transmit the ping are best positioned for the requested or desired charging procedure.

Significant power savings can be achieved when a search is conducted to locate a device placed on or near in a multi-coil, free position charging pad before using pings to establish that the device is configured to receive charge from a wireless charging device. The savings in power consumption can be obtained by refraining from providing pings until a device is detected in a search, and by limiting ping transmissions to transmitting coils that are placed in proximity to the detected device and likely to be capable of establishing an electromagnetic charging connection with the detected device.

Passive Ping

Wireless charging devices may be adapted in accordance with certain aspects disclosed herein to support a low-power discovery technique that can replace and/or supplement conventional ping transmissions. A conventional ping is produced by driving a resonant LC circuit that includes a transmitting coil of a base station. The base station then waits for an ASK-modulated response from the receiving device. A low-power discovery technique may include utilizing a passive ping to provide fast and/or low-power discovery. According to certain aspects, a passive ping may be produced by driving a network that includes the resonant LC circuit with a fast pulse that includes a small amount of energy. The fast pulse excites the resonant LC circuit and causes the network to oscillate at its natural resonant frequency until the injected energy decays and is dissipated. In one example, the fast pulse may have a duration corresponding to a half cycle of the resonant frequency of the network and/or the resonant LC circuit. When the base station is configured for wireless transmission of power within the frequency range 100 kHz to 200 kHz, the fast pulse may have a duration that is less than 2.5 μs.

The passive ping may be characterized and/or configured based on the natural frequency at which the network including the resonant LC circuit rings, and the rate of decay of energy in the network. The ringing frequency of the network and/or resonant LC circuit may be defined as:

$$\omega = \frac{1}{\sqrt{LC}} \quad \text{(Eq. 1)}$$

The rate of decay is controlled by the quality factor (Q factor) of the oscillator network, as defined by:

$$Q = \frac{1}{R}\sqrt{\frac{L}{C}} \quad \text{(Eq. 2)}$$

Equations 1 and 2 show that resonant frequency is affected by L and C, while the Q factor is affected by L, C and R. In a base station provided in accordance with certain aspects disclosed herein, the wireless driver has a fixed value of C determined by the selection of the resonant capacitor. The values of L and R are determined by the wireless transmitting coil and by an object or device placed adjacent to the wireless transmitting coil.

The wireless transmitting coil is configured to be magnetically coupled with a receiving coil in a device placed within close proximity of the transmitting coil, and to couple some of its energy into the proximate device to be charged. The L and R values of the transmitter circuit can be affected by the characteristics of the device to be charged, and/or other objects within close proximity of the transmitting coil. As an example, if a piece of ferrous material with a high magnetic permeability placed near the transmitter coils can increase the total inductance (L) of the transmitter coil, resulting in a lower resonant frequency, as shown by Equation 1. Some energy may be lost through heating of materials due to eddy current induction, and these losses may be characterized as an increase the value of R thereby lowering the Q factor, as shown by Equation 2.

A wireless receiver placed in close proximity to the transmitter coil can also affect the Q factor and resonant frequency. The receiver may include a tuned LC network with a high Q which can result in the transmitter coil having a lower Q factor. The resonant frequency of the transmitter coil may be reduced due to the addition of the magnetic material in the receiver, which is now part of the total magnetic system. Table 1 illustrates certain effects attributable to different types of objects placed within close proximity to the transmitter coil.

TABLE 1

| Object | L | R | Q | Frequency |
| --- | --- | --- | --- | --- |
| None present | Base Value | Base value | Base Value (High) | Base Value |
| Ferrous | Small Increase | Large Increase | Large Decrease | Small Decrease |
| Non-ferrous | Small Decrease | Large Increase | Large Decrease | Small Increase |
| Wireless Receiver | Large Increase | Small Decrease | Small Decrease | Large Decrease |

Figure 9:
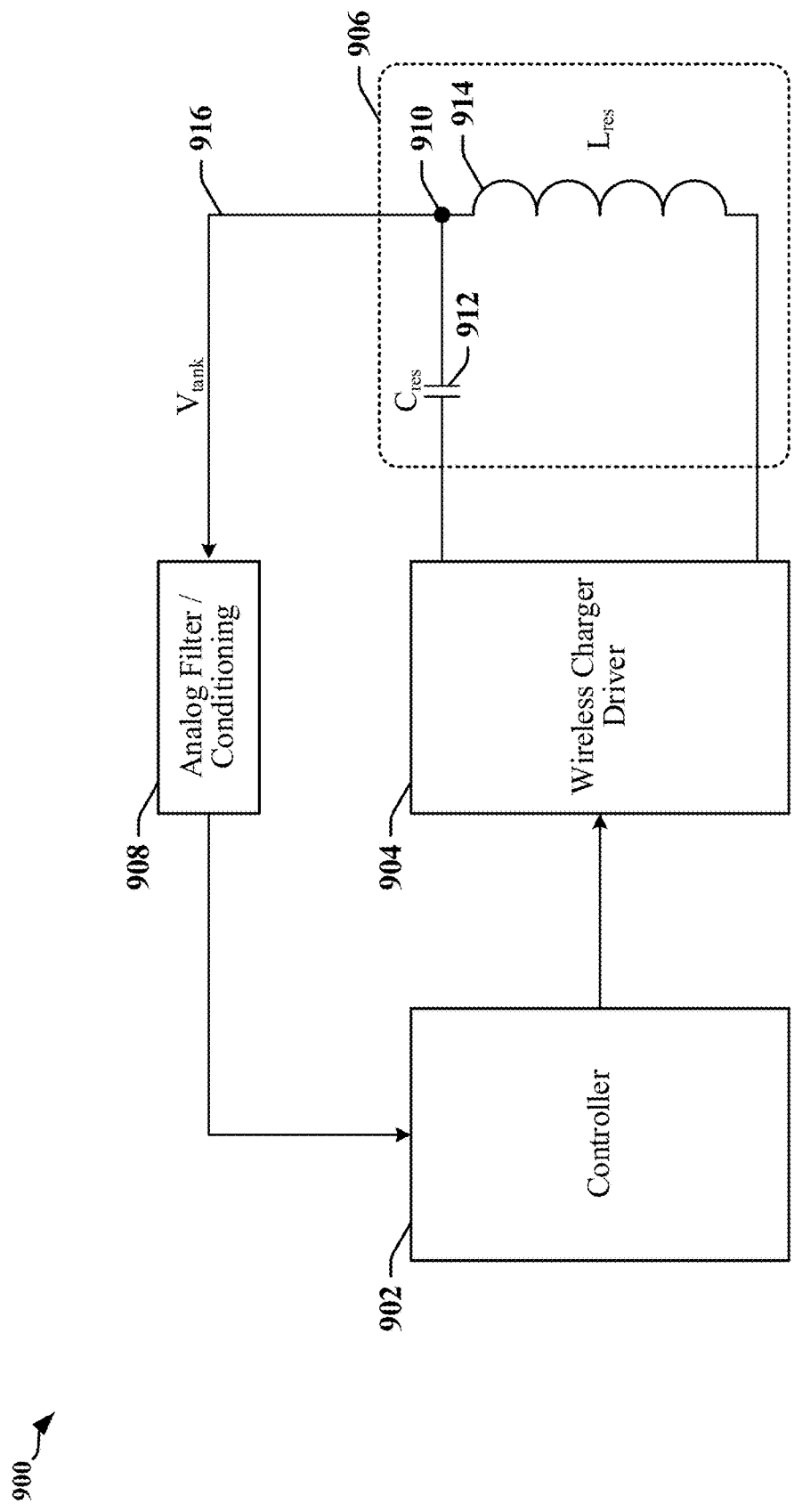
FIG. 9 illustrates a wireless transmitter that may be provided in a charger base station in accordance with certain aspects disclosed herein.

FIG. 9 illustrates a wireless transmitter 900 that may be provided in a charger base station. A controller 902 may receive a feedback signal filtered or otherwise processed by a filter circuit 908. The controller may control the operation of a driver circuit 904 that provides an alternating current to a resonant circuit 906 that includes a capacitor 912 and inductor 914. The voltage 916 measured at an LC node 910 of the resonant circuit 906.

Passive ping techniques may use the voltage and/or current measured or observed at the LC node 910 to identify the presence of a receiving coil in proximity to the charging pad of a device adapted in accordance with certain aspects disclosed herein. In many conventional wireless charger transmitters, circuits are provided to measure voltage at the LC node 910 or the current in the network. These voltages and currents may be monitored for power regulation purposes and/or to support communication between devices. In the example illustrated in FIG. 9, voltage at the LC node 910, although it is contemplated that current may additionally or alternatively be monitored to support passive ping. A response of the resonant circuit 906 to a passive ping (initial voltage $V_0$) may be represented by the voltage ($V_{LC}$) at the LC node 910, such that:

$$V_{LC} = V_0 e^{-\left(\frac{\omega}{2Q}\right)t} \quad \text{(Eq. 3)}$$

Figure 10:
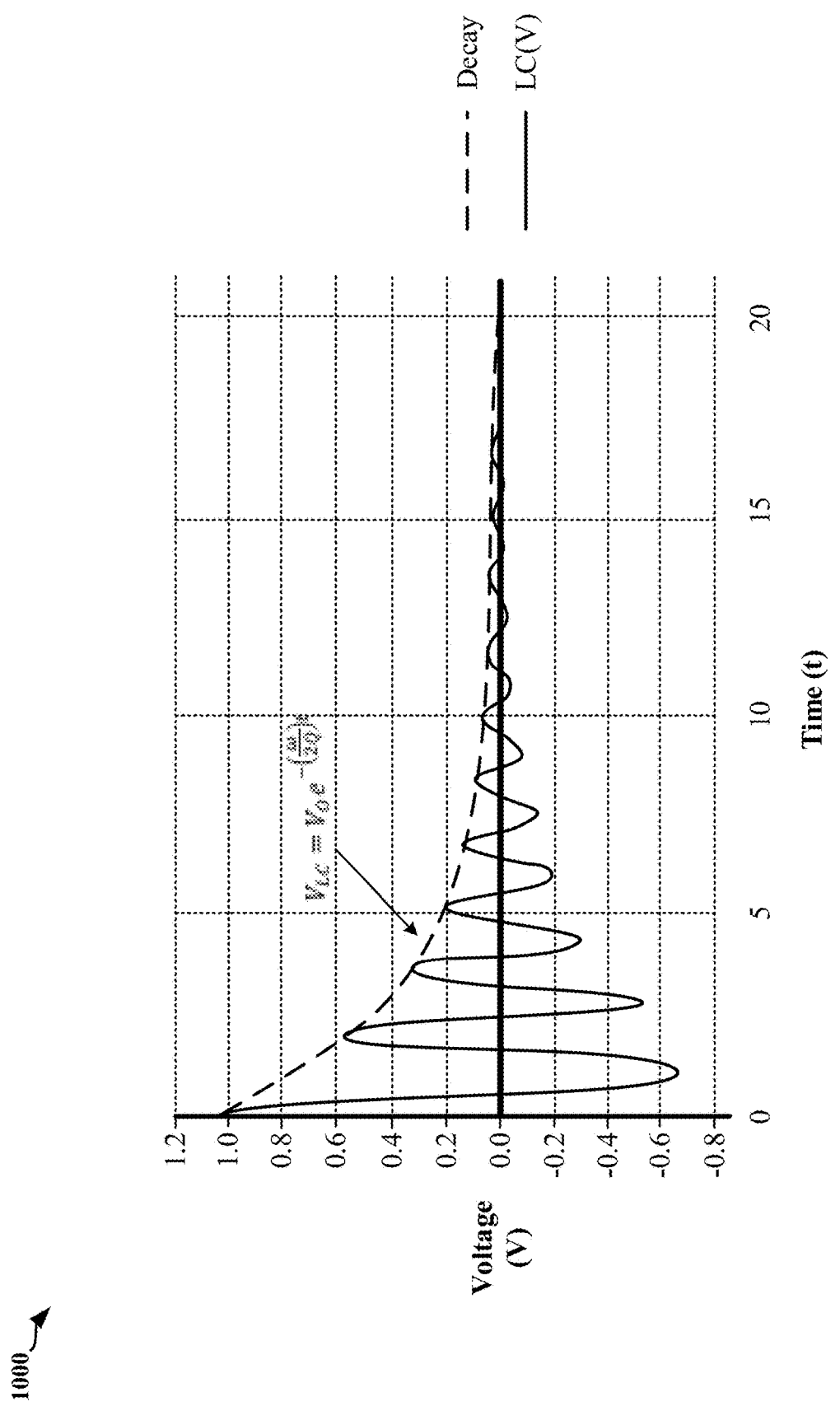
FIG. 10 illustrates a first example of a response to a passive ping in accordance with certain aspects disclosed herein.

FIG. 10 illustrates a first example in which a response 1000 to a passive ping decays according to Equation 3. After the excitation pulse at time=0, the voltage and/or current is seen to oscillate at the resonant frequency defined by Equation 1, and with a decay rate defined by Equation 3. The first cycle of oscillation begins at voltage level $V_0$ and $V_{LC}$ continues to decay to zero as controlled by the Q factor and ω. The example illustrated in FIG. 10 represents a typical open or unloaded response when no object is present or proximate to the charging pad. In FIG. 10 the value of the Q factor is assumed to be 20.

Figure 11:
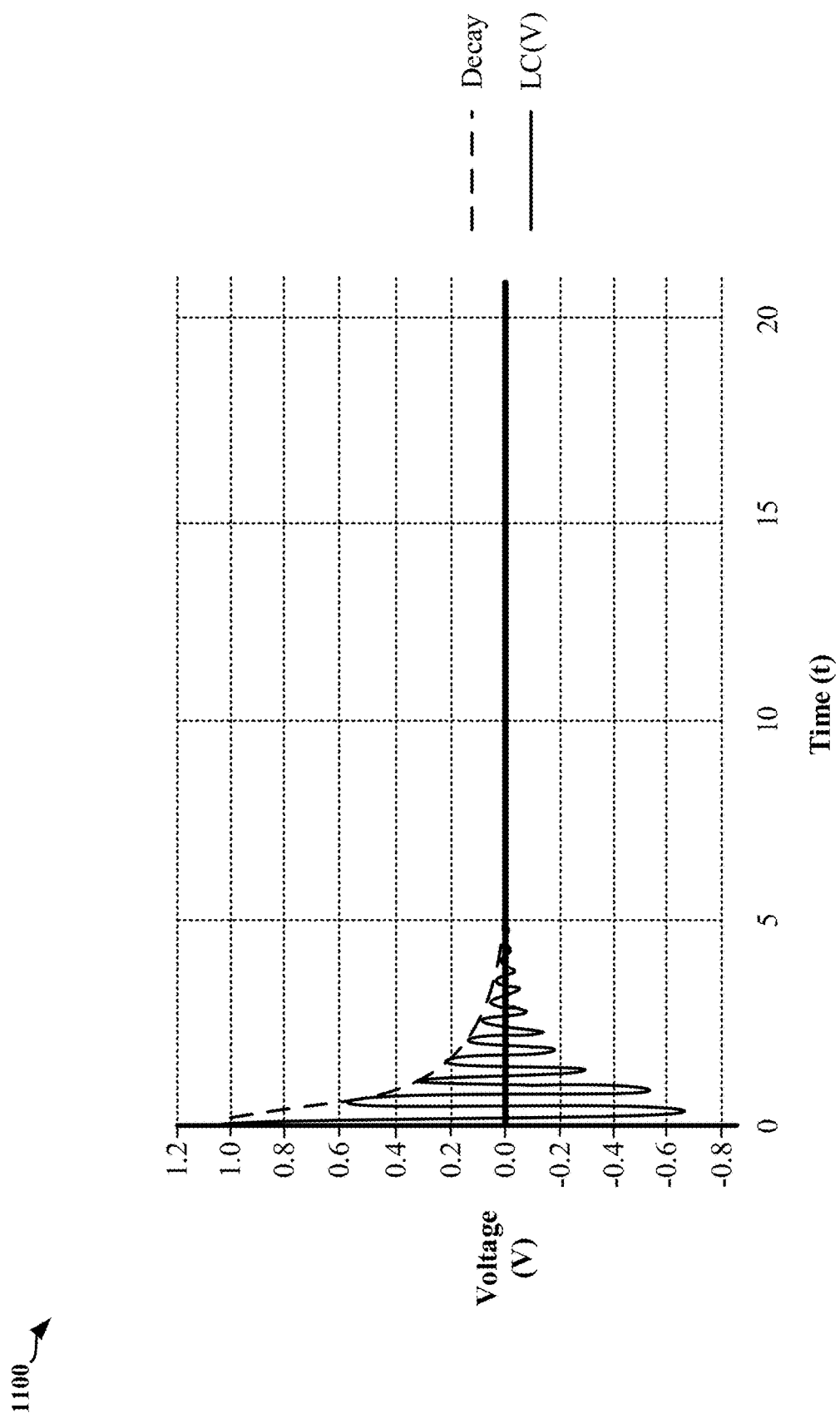
FIG. 11 illustrates a second example of a response to a passive ping in accordance with certain aspects disclosed herein.

FIG. 11 illustrates a second example in which a response 1100 to a passive ping decays according to Equation 3. After the excitation pulse at time=0, the voltage and/or current is seen to oscillate at the resonant frequency defined by Equation 1, and with a decay rate defined by Equation 3. The first cycle of oscillation begins at voltage level $V_0$ and $V_{LC}$ continues to decay to zero as controlled by the Q factor and ω. The example illustrated in FIG. 11 represents a loaded response when an object is present or proximate to the charging pad loads the coil. In FIG. 11 the Q factor may have a value of 7. $V_{LC}$ oscillates at a higher in the voltage response 1100 with respect to the voltage response 1000.

Figure 12:
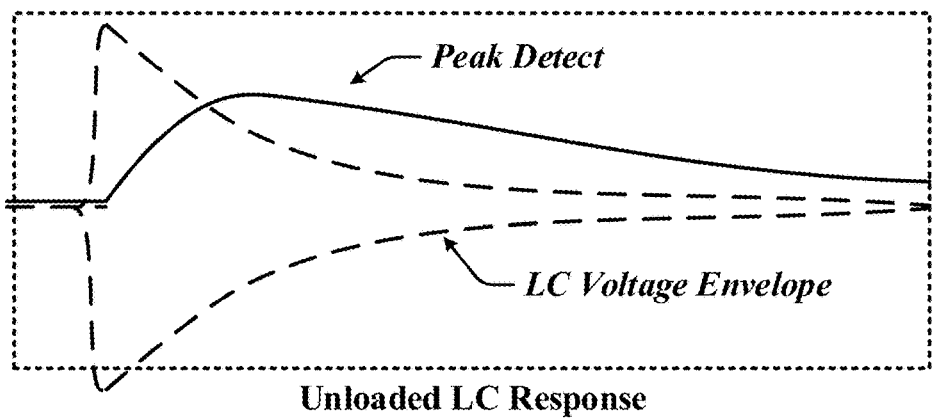
FIG. 12 illustrates examples of observed differences in responses to a passive ping in accordance with certain aspects disclosed herein.
Figure 12:
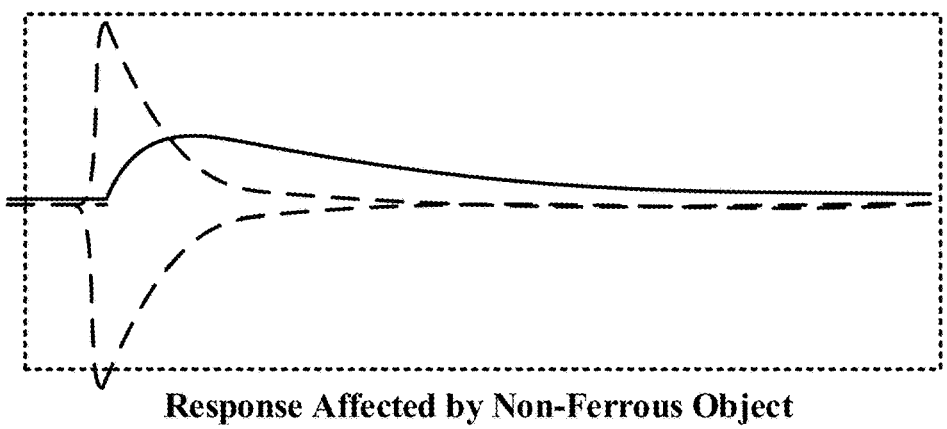
Figure 12:
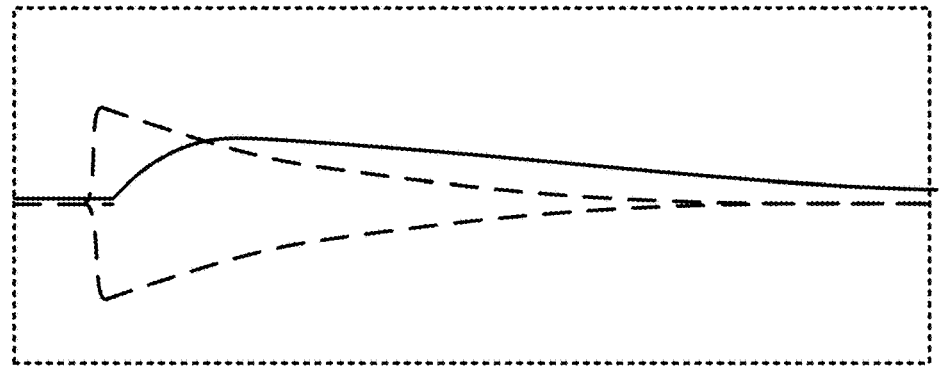

FIG. 12 illustrates a set of examples in which differences in responses 1200, 1220, 1240 may be observed. A passive ping is initiated when a driver circuit 904 excites the resonant circuit 906 using a pulse that is shorter than 2.5 μs. Different types of wireless receivers and foreign objects placed on the transmitter result in different responses observable in the voltage at the LC node 910 or current in the resonant circuit 906 of the transmitter. The differences may indicate variations in the Q factor of the resonant circuit 906 frequency of the oscillation of $V_0$. Table 2 illustrates certain examples of objects placed on the charging pad in relation to an open state.

TABLE 2

| Object | Frequency | $V_{peak}$ (mV) | 50% Decay Cycles | Q Factor |
|---|---|---|---|---|
| None present | 96.98 kHz | 134 mV | 4.5 | 20.385 |
| Type-1 Receiver | 64.39 kHz | 82 mV | 3.5 | 15.855 |
| Type-2 Receiver | 78.14 kHz | 78 mV | 3.5 | 15.855 |
| Type-3 Receiver | 76.38 kHz | 122 mV | 3.2 | 14.496 |
| Misaligned Type-3 Receiver | 210.40 kHz | 110 mV | 2.0 | 9.060 |
| Ferrous object | 93.80 kHz | 110 mV | 2.0 | 9.060 |
| Non-ferrous object | 100.30 kHz | 102 mV | 1.5 | 6.795 |

In Table 2, the Q factor may be calculated as follows:

$$Q = \frac{\pi N}{\ln(2)} \cong 4.53 N, \quad \text{(Eq. 3)}$$

where N is the number of cycles from excitation until amplitude falls below 0.5 $V_0$.

Figure 13:
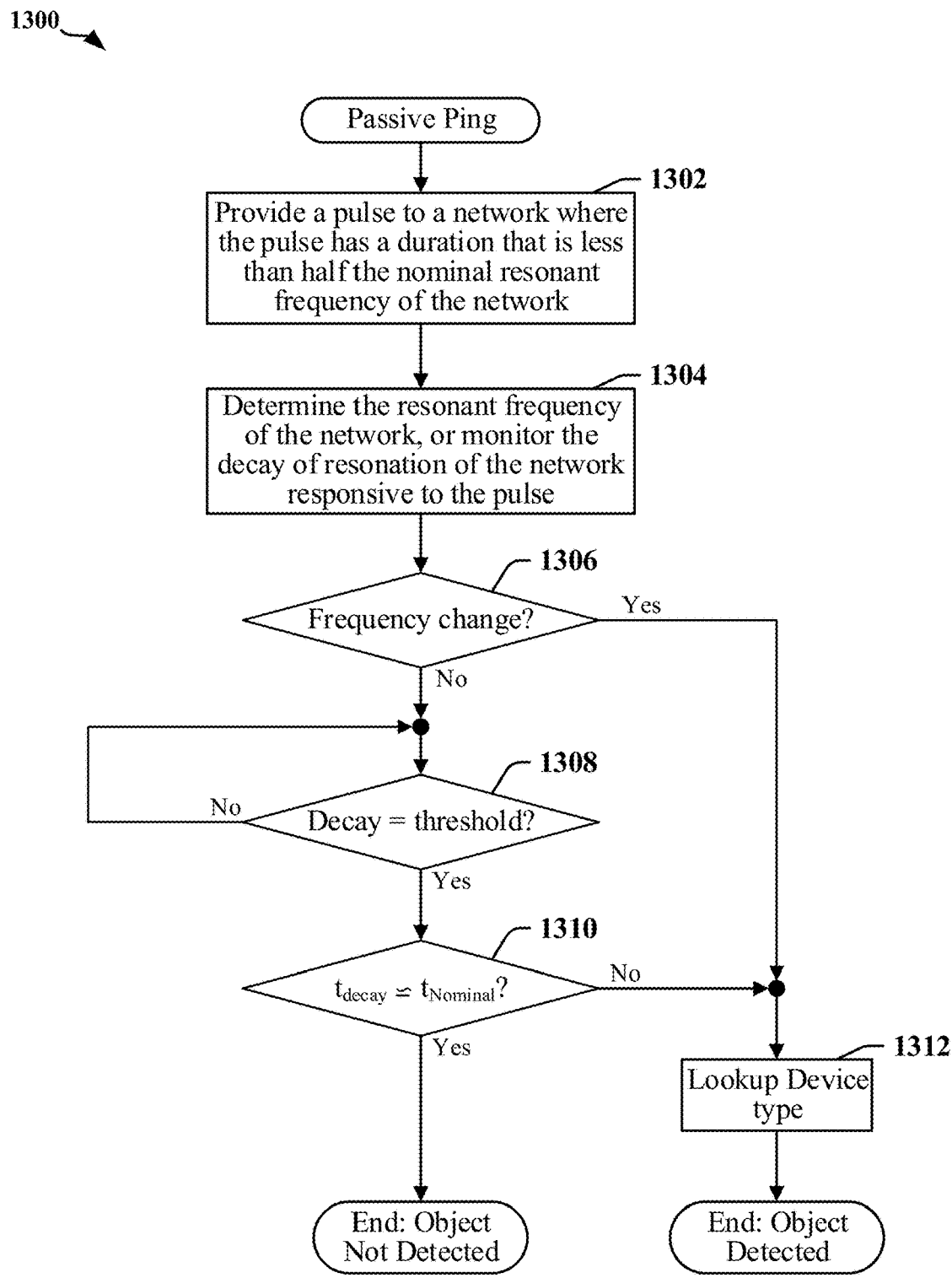
FIG. 13 is a flowchart that illustrates a method involving passive ping implemented in a wireless charging device adapted in accordance with certain aspects disclosed herein.

FIG. 13 is a flowchart 1300 that illustrates a method involving passive ping implemented in a wireless charging device adapted in accordance with certain aspects disclosed herein. At block 1302, a controller may generate a short excitation pulse and may provide the short excitation pulse to a network that includes a resonant circuit. The network may have a nominal resonant frequency and the short excitation pulse may have a duration that is less than half the nominal resonant frequency of the network. The nominal resonant frequency may be observed when the transmitting coil of the resonant circuit is isolated from external objects, including ferrous objects, non-ferrous objects and/or receiving coils in a device to be charged.

At block 1304, the controller may determine the resonant frequency of the network or may monitor the decay of resonation of the network responsive to the pulse. According to certain aspects disclosed herein, the resonant frequency and/or the Q factor associated with the network may be altered when a device or other object is placed in proximity to the transmitting coil. The resonant frequency may be increased or decreased from the nominal resonant frequency observed when the transmitting coil of the resonant circuit is isolated from external objects. The Q factor of the network may be increased or decreased with respect to a nominal Q factor measurable when the transmitting coil of the resonant circuit is isolated from external objects. According to certain aspects disclosed herein, the duration of delay can be indicative of the presence or type of an object placed in proximity to the transmitting coil when differences in Q factor prolong or accelerate decay of amplitude of oscillation in the resonant circuit with respect to delays associated with a nominal Q factor.

In one example, the controller may determine the resonant frequency of the network using a transition detector circuit configured to detect zero crossings of a signal representative of the voltage at the LC node 910 using a comparator or the like. In some instances, direct current (DC) components may be filtered from the signal to provide a zero crossing. In some instances, the comparator may account for a DC component using an offset to detect crossings of a common voltage level. A counter may be employed to count the detected zero crossings. In another example the controller may determine the resonant frequency of the network using a transition detector circuit configured to detect crossings through a threshold voltage by a signal representative of the voltage at the LC node 910, where the amplitude of the signal is clamped or limited within a range of voltages that can be detected and monitored by logic circuits. In this example, a counter may be employed to count transitions in the signal. The resonant frequency of the network may be measured, estimated and/or calculated using other methodologies.

In another example, a timer or counter may be employed to determine the time elapsed for $V_{LC}$ to decay from voltage level $V_0$ to a threshold voltage level. The elapsed time may be used to represent a decay characteristic of the network. The threshold voltage level may be selected to provide sufficient granularity to enable a counter or timer to distinguish between various responses 1200, 1220, 1240 to the pulse. $V_{LC}$ may be represented by detected or measured peak, peak-to-peak, envelope and/or rectified voltage level. The decay characteristic of the network may be measured, estimated and/or calculated using other methodologies.

If at block 1306, the controller determines that a change in resonant frequency with respect to a nominal resonant frequency indicate presence of an object in proximity to the transmitting coil, the controller may attempt to identify the object at block 1312. If the controller determines at block 1306 that resonant frequency is substantially the same as the nominal resonant frequency, the controller may consider the decay characteristic of the amplitude of oscillation in the resonant circuit at block 1308. The controller may determine that the resonant frequency of the network is substantially the same as the nominal resonant frequency when the frequency remains within a defined frequency range centered on, or including the nominal resonant frequency. In some implementations, the controller may identify objects using changes in resonant frequency and decay characteristics. In these latter implementations, the controller may continue at block 1308 regardless of resonant frequency, and may use changes in change in resonant frequency as an additional parameter when identifying an object positioned proximately the transmission coil.

At block 1308, the controller may use a timer and/or may count the cycles of the oscillation in the resonant circuit that have elapsed between the initial $V_O$ amplitude and a threshold amplitude used to assess the decay characteristic. In one example, $V_O/2$ may be selected as the threshold amplitude. At block 1310, the number of cycles or the elapsed time between the initial $V_O$ amplitude and the threshold amplitude may be used to characterize decay in the amplitude of oscillation in the resonant circuit, and to compare the characterize decay with a corresponding nominal decay characteristic. If at block 1310, no change in frequency and delay characteristic is detected, the controller may terminate the procedure with a determination that no object is proximately located to the transmission coil. If at block 1310, a change in frequency and/or delay characteristic has been detected, the controller may identify the object at block 1312.

At block 1312, the controller may be configured to identify receiving devices placed on a charging pad. The controller may be configured to ignore other types of objects, or receiving devices that are not optimally placed on the charging pad including, for example, receiving devices that are misaligned with the transmission coil that provides the passive ping. In some implementations, the controller may use a lookup table indexed by resonant frequency, decay time, change in resonant frequency, change in decay time and/or Q factor estimates. The lookup table may provide information identifying specific device types, and/or charging parameters to be used when charging the identified device or type of device.

Passive ping uses a very short excitation pulse that can be less than a half-cycle of the nominal resonant frequency observed at the LC node 910 in the resonant circuit 906. A conventional ping may actively drive a transmission coil for more than 16,000 cycles. The power and time consumed by a conventional ping can exceed the power and time use of a passive ping by several orders of magnitude. In one example, a passive ping consumes approximately 0.25 µJ per ping with a max ping time of around ~100 µs, while a conventional active ping consumes approximately 80 mJ per ping with a max ping time of around 90 ms. In this example, energy dissipation may be reduced by a factor of 320,000 and the time per ping may be reduced by a factor of 900.

Passive ping may also be coupled with another, reduced-power sensing methodology, such as capacitive sensing. Capacitive sensing or the like can provide an ultra-low power detection method that determines presence or non-presence of an object is in proximity to the charging surface. After capacitive sense detection, a passive ping can be transmitted sequentially or concurrently on each coil to produce a more accurate map of where a potential receiving device and/or object is located. After a passive ping procedure has been conducted, an active ping may be provided in the most likely device locations. An example algorithm for device location sensing, identification and charging is illustrated in FIG. 14.

Figure 14:
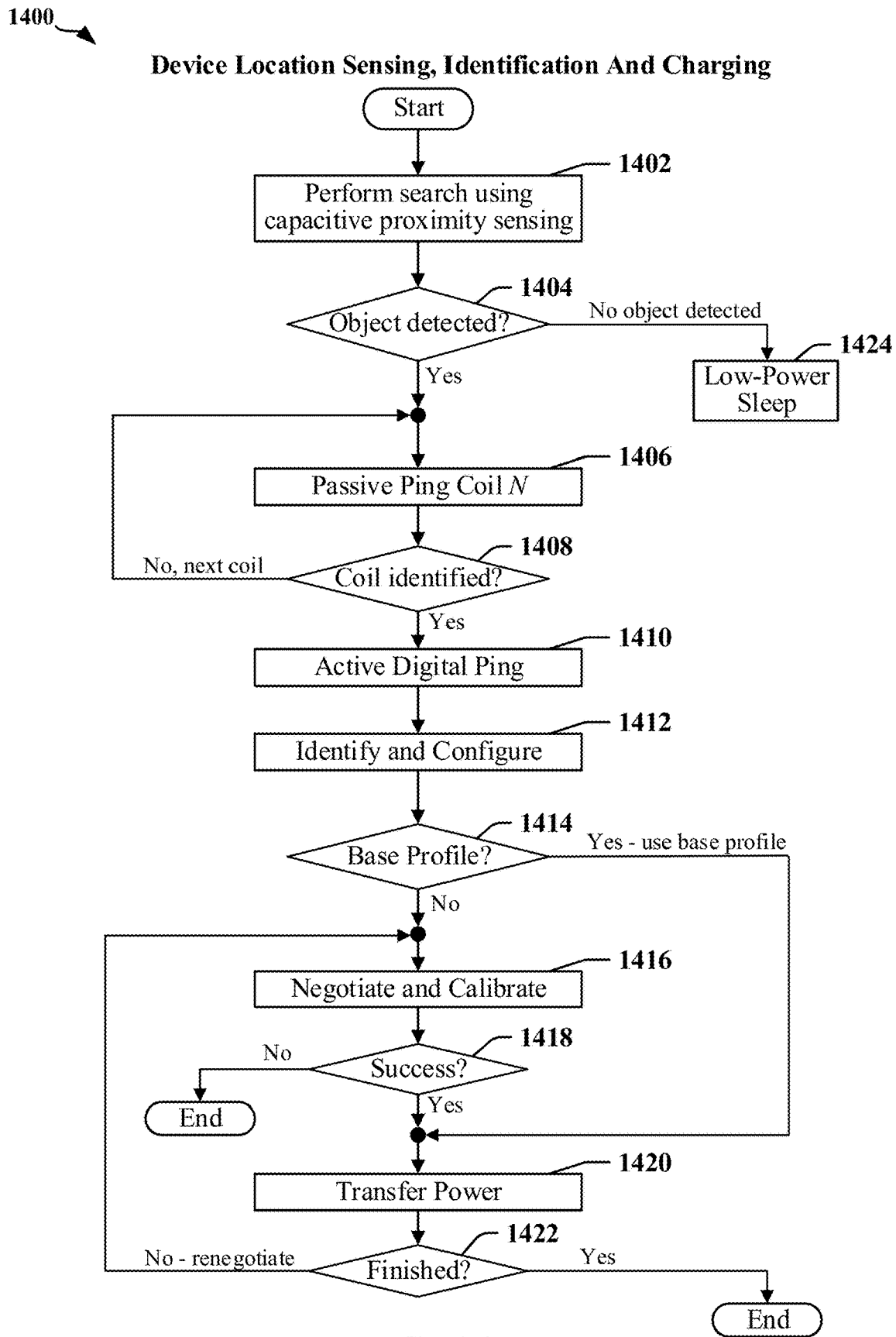
FIG. 14 is a flowchart that illustrates a power transfer management procedure that may be employed by a wireless charging device implemented in accordance with certain aspects disclosed herein.

FIG. 14 is a flowchart 1400 that illustrates a power transfer management procedure involving multiple sensing and/or interrogation techniques that may be employed by a wireless charging device implemented in accordance with certain aspects disclosed herein. The procedure may be initiated periodically and, in some instances, may be initiated after the wireless charging device exits a low-power or sleep state. In one example, the procedure may be repeated at a frequency calculated to provide sub-second response to placement of a device on a charging pad. The procedure may be re-entered when an error condition has been detected during a first execution of the procedure, and/or after charging of a device placed on the charging pad has been completed.

At block 1402, a controller may perform an initial search using capacitive proximity sensing. Capacitive proximity sensing may be performed quickly and with low power dissipation. In one example, capacitive proximity sensing may be performed iteratively, where one or more transmission coils is tested in each iteration. The number of transmission coils tested in each iteration may be determined by the number of sensing circuits available to the controller. At block 1404, the controller may determine whether capacitive proximity sensing has detected the presence or potential presence of an object proximate to one of the transmission coils. If no object is detected by capacitive proximity sensing, the controller may cause the charging device to enter a low-power, idle and/or sleep state at block 1424. If an object has been detected, the controller may initiate passive ping sensing at block 1406.

At block 1406, the controller may initiate passive ping sensing to confirm presence of an object near one or more transmission coils, and/or to evaluate the nature of the proximately-located object. Passive ping sensing may consume a similar quantity of power but span a greater of time than capacitive proximity sensing. In one example, each passive ping can be completed in approximately 100 µs and may expend 0.25 µJ. A passive ping may be provided to each transmission coil identified as being of-interest by capacitive proximity sensing. In some implementations, a passive ping may be provided to transmission coils near each transmission coil identified as being of-interest by capacitive proximity sensing, including overlaid transmission coils. At block 1408, the controller may determine whether passive ping sensing has detected the presence of a potentially chargeable device proximate to one of the transmission coils that may be a receiving device. If a potentially chargeable device has been detected, the controller may initiate active digital ping sensing at block 1410. If no potential chargeable device has been detected, passive ping sensing may continue at block 1406 until all of the coils have been tested and/or the controller terminates passive ping sensing. In one example, the controller terminates passive ping sensing after all transmitting coils have been tested. When passive ping sensing fails to find a potentially chargeable device, the controller the controller may cause the charging device to enter a low-power, idle and/or sleep state. In some implementations, passive ping sensing may be paused when a potentially chargeable device is detected so that an active ping can be used to interrogate the potentially chargeable device. Passive ping sensing may be resumed after the results of an active ping have been obtained.

At block 1410, the controller may use an active ping to interrogate a potentially chargeable device. The active ping may be provided to a transmitting coil identified by passive ping sensing. In one example, a standards-defined active ping exchange can be completed in approximately 90 ms and may expend 80 mJ. An active ping may be provided to each transmission coil associated with a potentially chargeable device.

At block 1412, the controller may identify and configure a chargeable device. The active ping provided at block 1410 may be configured to stimulate a chargeable device such that it transmits a response that includes information identifying the chargeable device. In some instances, the controller may fail to identify or configure a potentially chargeable device detected by passive ping, and the controller may resume a search based on passive ping at block 1406. At block 1414, the controller may determine whether a baseline charging profile or negotiated charging profile should be used to charge an identified chargeable device. The baseline, or default charging profile may be defined by standards. In one example, the baseline profile limits charging power to 5 W. In another example, a negotiated charging profile may enable charging to proceed at up to 15 W. When a baseline charging profile is selected, the controller may begin transferring power (charging) at block 1420.

At block 1416, the controller may initiate a standards-defined negotiation and calibration process that can optimize power transfer. The controller may negotiate with the chargeable device to determine an extended power profile that is different from a power profile defined for the baseline charging profile. The controller may determine at block 1418 that the negotiation and calibration process has failed and may terminate the power transfer management procedure. When the controller determines at block 1418 that the negotiation and calibration process has succeeded, charging in accordance with the negotiate profile may commence at block 1420.

At block 1422, the controller may determine whether charging has been successfully completed. In some instances, an error may be detected when a negotiated profile is used to control power transfer. In the latter instance, the controller may attempt to renegotiate and/or reconfigure the profile at block 1416. The controller may terminate the power transfer management procedure when charging has been successfully completed.

Selectively Activating Coils

According to certain aspects disclosed herein, coils in one or more charging cells may be selectively activated to provide an optimal electromagnetic field for charging a compatible device. In some instances, coils may be assigned to charging cells, and some charging cells may overlap other charging cells. In the latter instances, the optimal charging configuration may be selected at the charging cell level. In other instances, charging cells may be defined based on placement of a device to be charged on a charging surface. In these other instances, the combination of coils activated for each charging event can vary. In some implementations, a charging device may include a driver circuit that can select one or more cells and/or one or more predefined charging cells for activation during a charging event.

Figure 15:
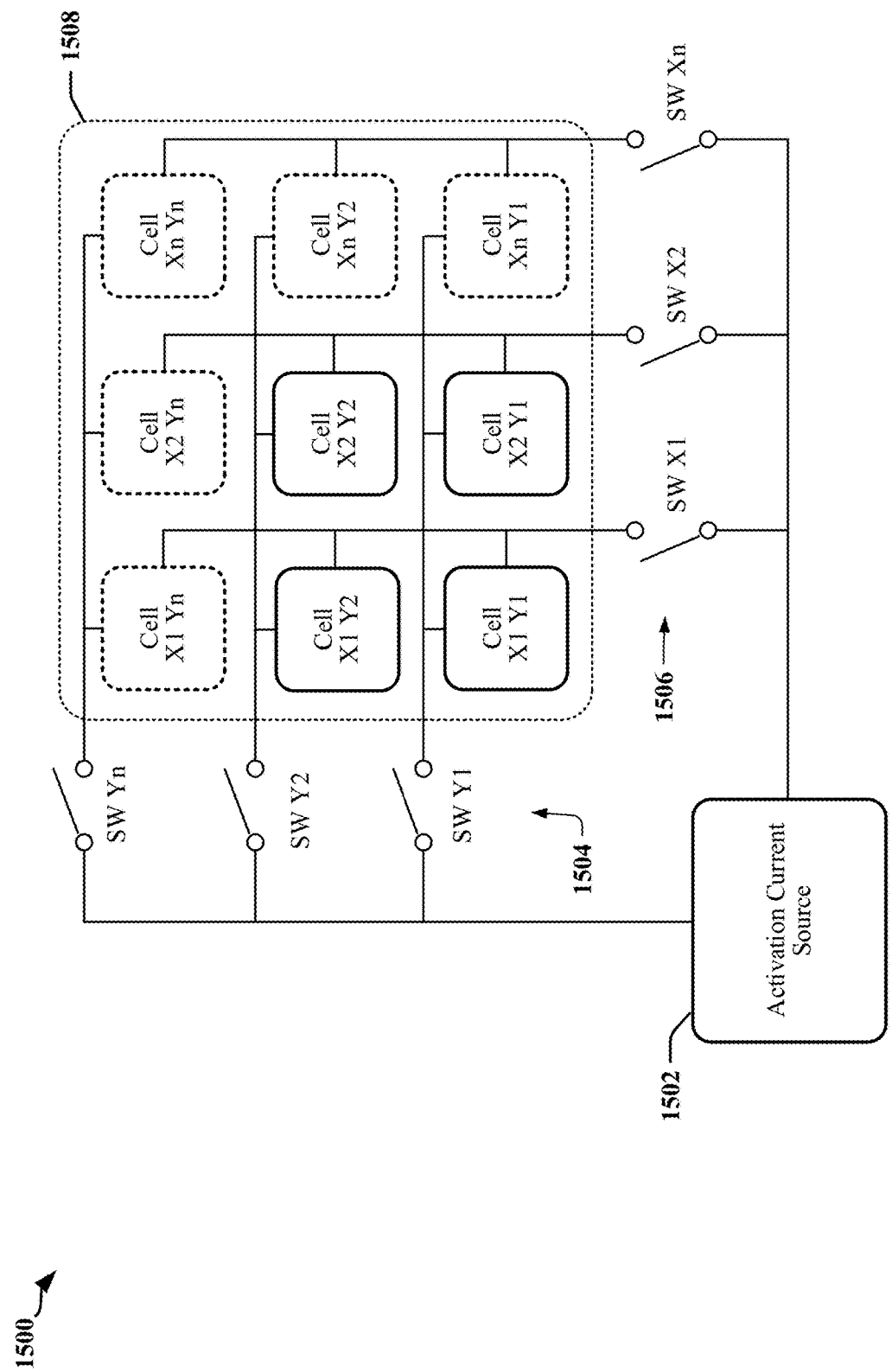
FIG. 15 illustrates a first topology that supports matrix multiplexing switching for use in a wireless charger adapted in accordance with certain aspects disclosed herein.

FIG. 15 illustrates a first topology 1500 that supports matrix multiplexing switching for use in a wireless charger adapted in accordance with certain aspects disclosed herein. The wireless charger may select one or more charging cells 100 to charge a receiving device. Charging cells 100 that are not in use can be disconnected from current flow. A relatively large number of charging cells 100 may be used in the honeycomb packaging configuration illustrated in FIG. 2 requiring a corresponding number of switches. According to certain aspects disclosed herein, the charging cells 100 may be logically arranged in a matrix 1508 having multiple cells connected to two or more switches that enable specific cells to be powered. In the illustrated topology 1500, a two-dimensional matrix 1508 is provided, where the dimensions may be represented by X and Y coordinates. Each of a first set of switches 1506 is configured to selectively couple a first terminal of each cell in a column of cells to a wireless transmitter and/or receiver circuit 1502 that provide current to activate coils during wireless charging. Each of a second set of switches 1504 is configured to selectively couple a second terminal of each cell in a row of cells to the wireless transmitter and/or receiver circuit 1502. A cell is active when both terminals of the cell are coupled to the wireless transmitter and/or receiver circuit 1502.

The use of a matrix 1508 can significantly reduce the number of switching components needed to operate a network of tuned LC circuits. For example, N individually connected cells require at least N switches, whereas a two-dimensional matrix 1508 having N cells can be operated with $\sqrt{N}$ switches. The use of a matrix 1508 can produce significant cost savings and reduce circuit and/or layout complexity. In one example, a 9-cell implementation can be implemented in a 3×3 matrix 1508 using 6 switches, saving 3 switches. In another example, a 16-cell implementation can be implemented in a 4×4 matrix 1508 using 8 switches, saving 8 switches.

During operation at least 2 switches are closed to actively couple one coil to a wireless transmitter and/or receiver circuit 1502. Multiple switches can be closed at once in order to facilitate connection of multiple coils to the wireless transmitter and/or receiver circuit 1502. Multiple switches may be closed, for example, to enable modes of operation that drive multiple transmitting coils when transferring power to a receiving device.

Figure 16:
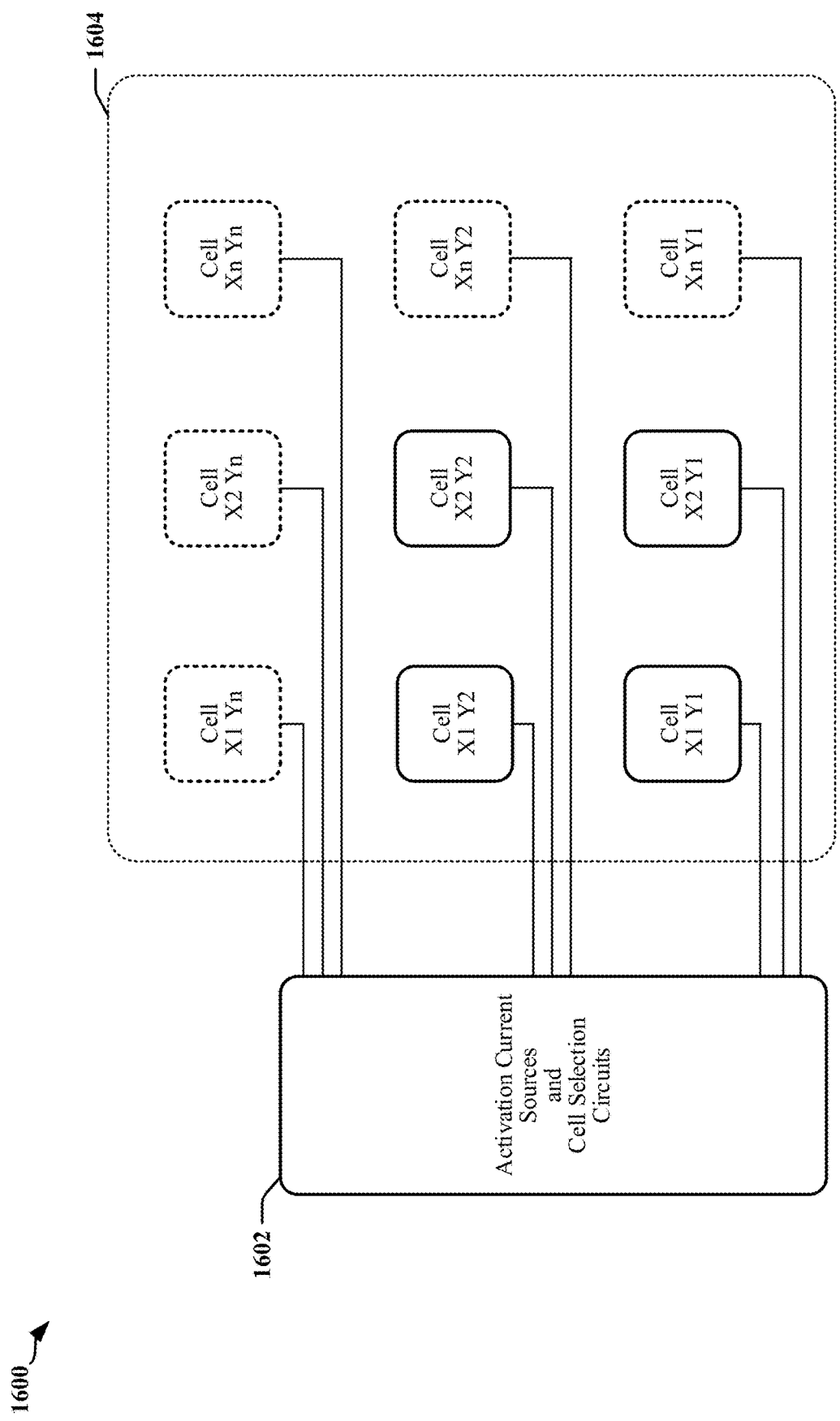
FIG. 16 illustrates a second topology that supports direct current drive in a wireless charger adapted in accordance with certain aspects disclosed herein.

FIG. 16 illustrates a second topology 1600 in which each coil or charging cell is individually and/or directly driven by a driver circuit 1602 in accordance with certain aspects disclosed herein. The driver circuit 1602 may be configured to select one or more coils or charging cells 100 from a group of coils 1604 to charge a receiving device. It will be appreciated that the concepts disclosed here in relation to charging cells 100 may be applied to selective activation of individual coils or stacks of coils. Charging cells 100 that are not in use receive no current flow. A relatively large number of charging cells 100 may be in use and a switching matrix may be employed to drive individual coils or groups of coils. In one example, a first switching matrix may configure connections that define a charging cell or group of coils to be used during a charging event and a second switching matrix (see, e.g., FIG. 15) may be used to activate the charging cell and/or group of selected coils.

The availability of direct drive to one or more coils may permit the charging device to concurrently transmit a ping through different groupings of coils 600, 620 (see FIG. 6).

In some implementations, capacitive sense can be used to determine location by first connecting two adjacent coils to the capacitive sense circuitry. Using these two coils the circuitry measures the capacitance by using one or more known methods. A first method includes applying a constant current waveform and calculating capacitance based on changes in voltage sensed by a measuring circuit. Calculation can be based on the following equations:

$$Q=C*V$$

$$Q=I*t$$

If a known charge is delivered (Q) by sourcing a known constant current (I) for a specified amount of time (t), the voltage (V) can be measured from which the capacitance (C) can be calculated. Measured capacitance can be compared to the last recorded measured value. Certain changes in capacitance are significant enough to indicate that the system has changed, enabling detection that something has become part of the system (e.g., a phone).

Figure 17:
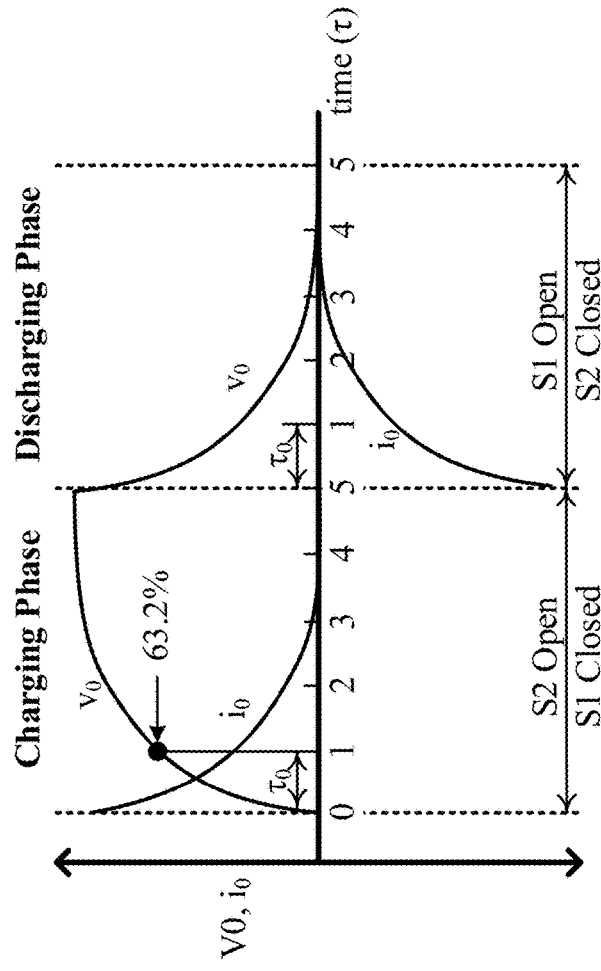
FIG. 17 illustrates an RC charging discharging cycle that characterizes certain charging devices adapted in accordance with certain aspects disclosed herein.

Changes in capacitance can be measured through the use of an RC time constant. A constantly varying square wave signal can be applied across a known resistance (R) and the unknown capacitance (C or Cx). The time to charge/discharge can them be measured using a timer and comparator. By using the time constant equation, capacitance can be calculated. FIG. 17 illustrates an RC charging discharging cycle 1700. In accordance with certain aspects disclosed herein, the charging coils in a wireless charger can be used as the differential sense elements.

Capacitance measurements may be taken from coils in a defined sequence until all locations have been tested. Changes and/or magnitude of changes measured from the coils can identify location of a device to be charged. The process can be repeated cyclically that may repeat based on a configured interval time. The scan rate may be selected based on a compromise between speed of detection and power draw. If lower power draw levels are desired scan rate can be decreased at the expense of lower detection speed or vice versa.

After sensing a device location, the location of one or more devices can be determined. Locations may be indicated by the combination of coils that register a large enough change in capacitance. Coils can be turned on in a first-come, first-serve basis. As devices are added, associated coils proximate to the device can be connected to a driver and activated. The number of devices that can be charged may be limited by the number drivers available to service devices.

Current flow through each of the coils is defined roughly by an appropriate wireless charging standard (e.g., the Qi standard), frequency, amplitude, etc. Certain aspects disclosed herein relate to identifying coils in an array that should be activated using array switches and corresponding circuitry and/or algorithms.

According to certain aspects of this disclosure, the area that can be utilized for charging increases with the total surface area of the disclosed charging device. In conventional wireless chargers, a single Qi coil transmitter has an effective power transfer area that is <9.2% (based on the A6 coil, the most commonly used coil). A layout of coils provided in accordance with certain aspects disclosed herein can accomplish much higher ratios for charge area vs total area. In one example, a 100 mm×200 mm, 3-device configuration has an available charging area that is 57.2% of the charging device surface area. In another example, a 200 mm×200 mm, 6-device configuration has an available charging area that is 63.5% of the charging device surface area.

Batteries in Receiving Devices

Figure 18:
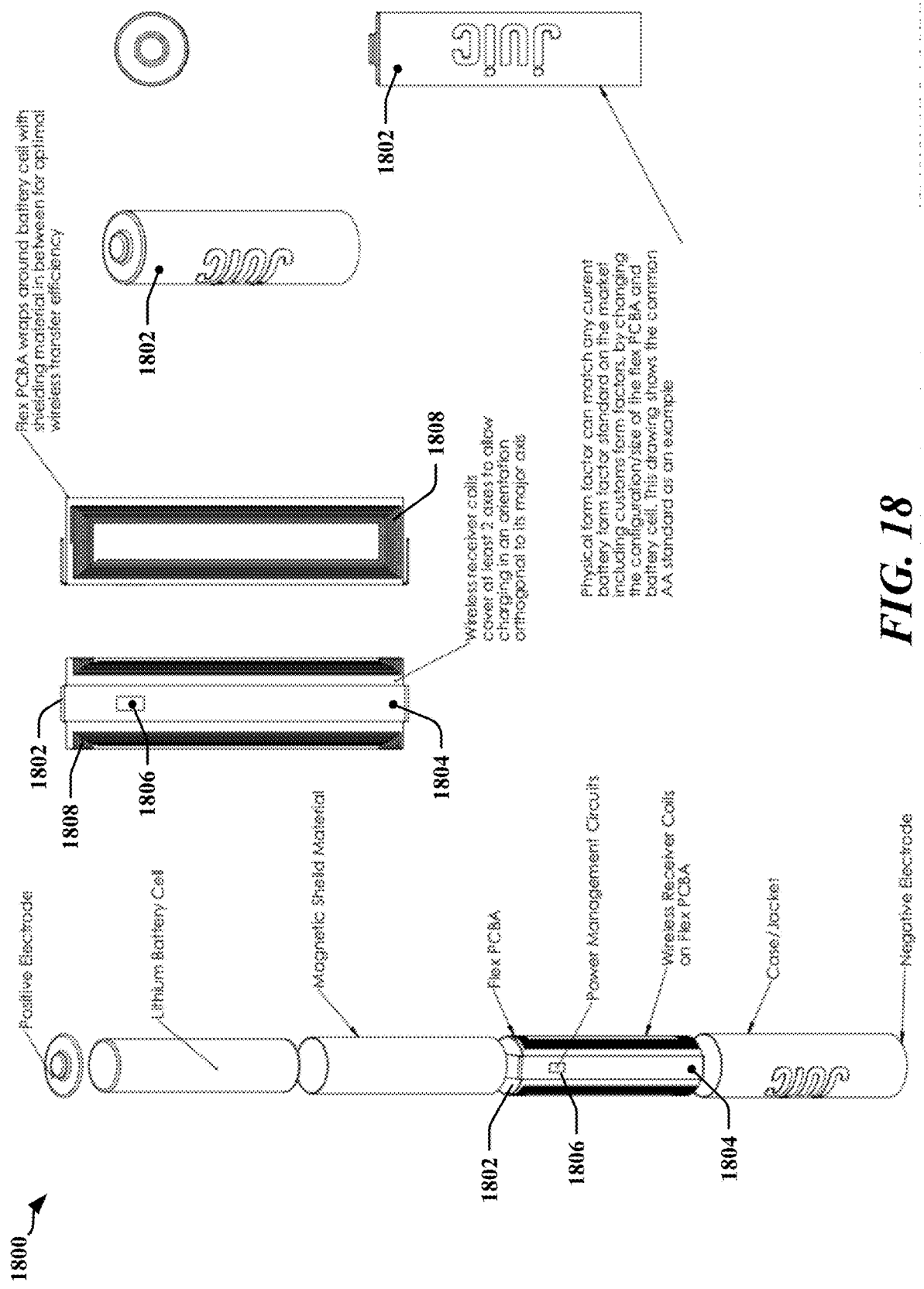
FIG. 18 illustrates a battery assembly in a receiving device that may be charged in accordance with certain aspects disclosed herein.

FIG. 18 illustrates a battery assembly 1800 in a receiving device. Batteries that have a standard form factor can be adapted for embedding in a device that uses Qi receiving technology adapted according to certain aspects disclosed herein. In some instances, a battery 1802 may be adapted for wireless charging through the addition of receiver. The receiver may be built-in to the battery 1802, provided on a flexible printed circuit board 1804 that wraps around the battery 1802, and/or provided within a battery holder. In various examples, a battery 1802 that has a conventional form factor such as AAA, AA, 9V, C, D, or other form factor may be adapted to support wireless charging in accordance with certain aspects disclosed herein. In other examples, batteries with a non-standard or proprietary physical form may be adapted to support wireless charging in accordance with certain aspects disclosed herein.

In some instances, a battery 1802 need not be removed from the host device in order to facilitate wireless charging, and a host device with special receiver may be operated to charge batteries in any orientation orthogonal to the largest dimensional axis.

The flexible printed circuit board 1804 may have a plurality of coils 1808 configured to present a power transfer area along at least two axes when the flexible printed circuit board 1804 is mounted on a battery 1802. The flexible printed circuit board 1804 may have a power management circuit 1806 electrically coupled to terminals of the battery 1802. The power management circuit 1806 may be adapted to determine charge level of the battery 1802, receive power transferred wirelessly from a wireless charging source, and provide a charging current to the terminals of the battery 1802 when the charge level of the battery 1802 is below a maximum threshold charge level and the wireless charging source is transferring power through one or more of the plurality of coils 1808.

In some examples, the axes include a pair of orthogonal axes on the surface of the battery 1802. The flexible printed circuit board 1804 may envelop, surround or enclose at least a portion of the battery 1802. The flexible printed circuit board 1804 may be conformed to at least a portion of the surface of the battery 1802.

In various implementations, the flexible printed circuit board 1804 has a sheet material configured to provide electromagnetic shielding. The sheet material may be positioned between the plurality of coils 1808 and the battery 1802 when the flexible printed circuit board 1804 is wrapped around the battery 1802.

In one example, the plurality of coils 1808 is formed using at least four metal layers of the flexible printed circuit board 1804.

Figure 19:
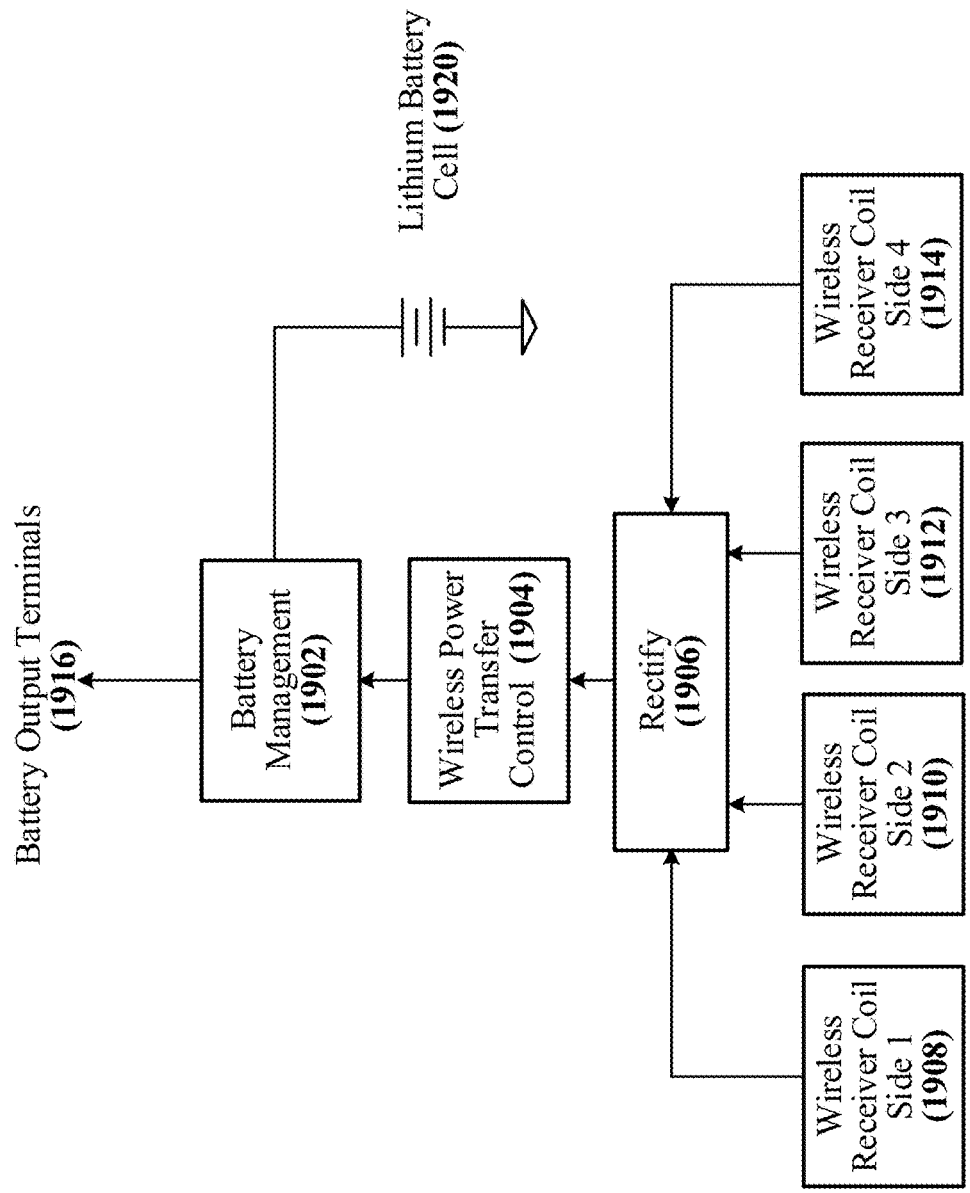
FIG. 19 is a block diagram illustrating the operation of a wireless charger in accordance with certain aspects disclosed herein.

FIG. 19 is a block diagram 1900 illustrating the operation of a receiving device that may be electromagnetically coupled to a wireless charger in accordance with certain aspects disclosed herein. The receiving device may include receiver coils 1908, 1910, 1912, 1914 that respond to the electromagnetic field produced by the wireless charger and that each contribute to a current provided to a rectifier 1906. The rectifier 1906 provides a rectified current to a power transfer controller 1904. The power transfer controller 1904 may be configured to provide a charging voltage to a battery management circuit 1902 that manages power transfer to a rechargeable battery cell 1920, typically through battery terminals 1916. In one example, the power transfer controller 1904 may include a charge pump or other power conditioning circuits.

Efficient Printed Circuit Board Manufacture for Wireless Charging Surfaces

Certain charging coils disclosed herein are manufactured using printed circuit boards that have 4 or more layers. In conventional systems, printed circuit board designs employing more than 2 layers, it can be advantageous to have an interconnect that passes through some layers but not all layers of the board. Blind vias penetrate a surface on only one side of the PCB, while buried vias connect internal layers without penetrating either surface of the PCB. The use of blind and buried vias can allow higher density packing of circuits onto a PCB. However, the use of blind and buried vias requires additional process steps in PCB production, that can increase cost and time of manufacturing substantially.

According to certain aspects disclosed herein, blind and buried vias can be implemented using standard low-cost PCB manufacturing techniques using through holes/vias without increased time and/or cost associated with PCB manufacture and assembly. In some instances, multiple standard-technology, low-cost PCBs may be joined to form a laminate using an adhesive or other mechanical means to bond boards together to form a single larger multilayer board. Interconnections can be made by pressing in pins or soldering a bus connection between the boards.

Figure 20:
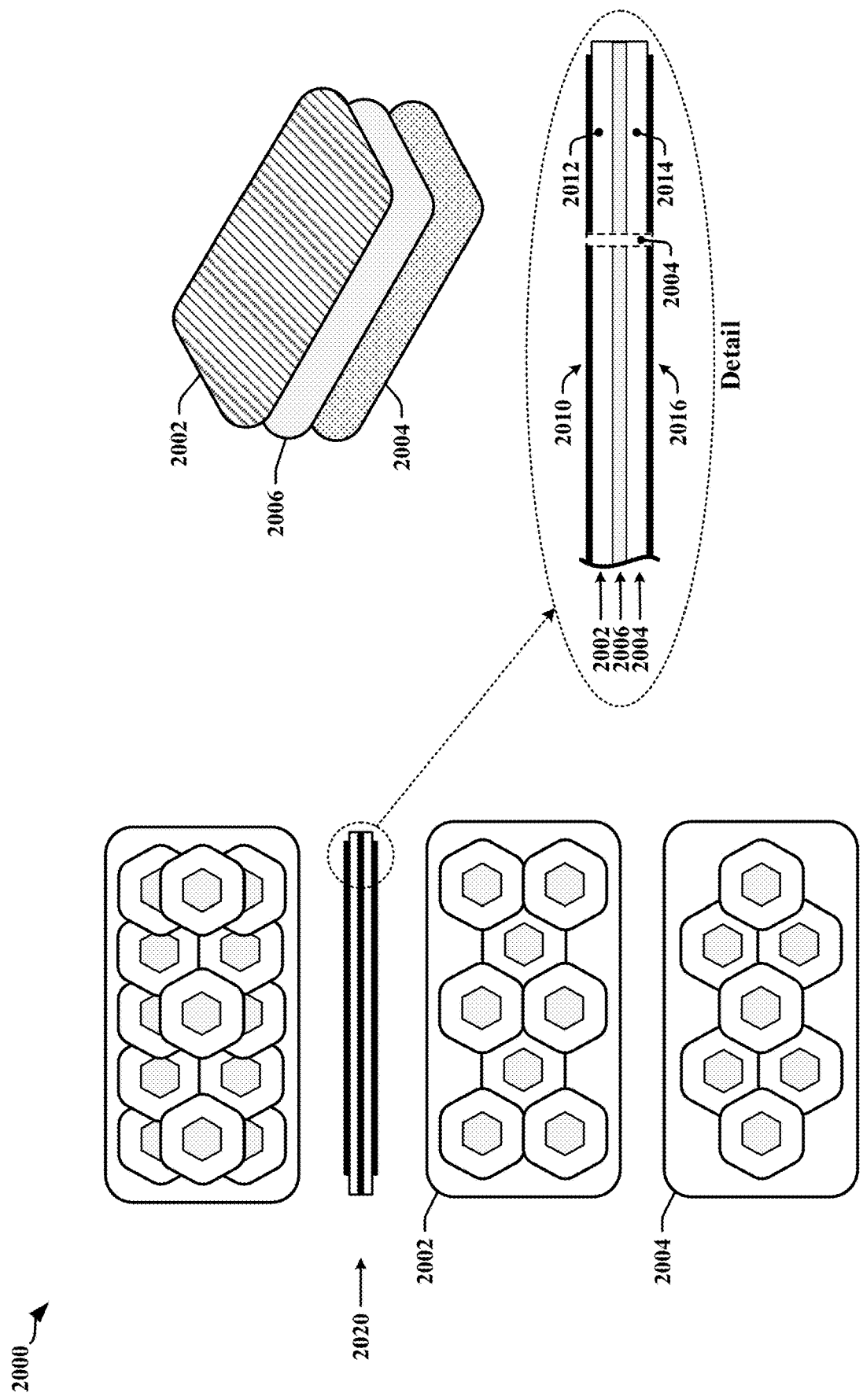
FIG. 20 illustrates an example of a PCB manufactured in accordance with certain aspects disclosed herein.

FIG. 20 illustrates an example of a circuit 2000 (profile view as indicated at 2020) manufactured in accordance with certain aspects disclosed herein. In some examples, multiple copies of the same PCB 2002, 2004 may be laminated to obtain a final product. In some instances, one or more PCBs 2002, 2004 can be mirrored, and layered as mirrored versions to form a single assembly with one or more PCBs 2002, 2004 that have not been mirrored. In the circuit 2000, two 2-layer PCBs 2002, 2004 of the same design are glued or otherwise joined together. In other examples, more than two PCBs 2002, 2004 may be layered to form the circuit 2000. The PCBs 2002, 2004 may have different layers, designs, thicknesses, etc.

In some examples, magnetic or shielding material may be provided within or with the adhesive layer 2006 provided between PCBs 2002, 2004 to facilitate on-board inductor operation, to shield circuits from EMI and/or for other purposes. Magnetic or shielding material cannot easily be inserted between PCBs 2002, 2004 that form layers of the circuit 2000, where the PCBs 2002, 2004 are obtained using conventional manufacturing techniques.

According to certain aspects disclosed herein, a charging surface includes a first PCB 2002 having a top layer 2010 and a bottom layer 2012. The top layer 2010 and the bottom layer 2012 may be metal, and/or insulated metal. The charging surface includes a second PCB 2004 having a top layer 2014 and a bottom layer 2016. The top layer 2014 and the bottom layer 2016 may be metal, and/or insulated metal. The charging surface includes an adhesive layer 2006 joining the first printed circuit board 2002 and the second printed circuit board 2004 such that the bottom layer 2012 of the first printed circuit board 2002 is adjacent to the top layer 2014 of the second printed circuit board 2004. The charging surface may also include one or more interconnects provided between the bottom layer 2012 of the first printed circuit board 2002 and the top layer 2014 of the second printed circuit board 2004.

In one example, at least one interconnect does not penetrate the top layer 2010 of the first printed circuit board 2002. One or more interconnects may not penetrate the bottom layer 2016 of the second printed circuit board 2004. The adhesive layer 2006 may include openings through which at least one interconnect passes between the first printed circuit board 2002 and the second printed circuit board 2004.

Figure 21:
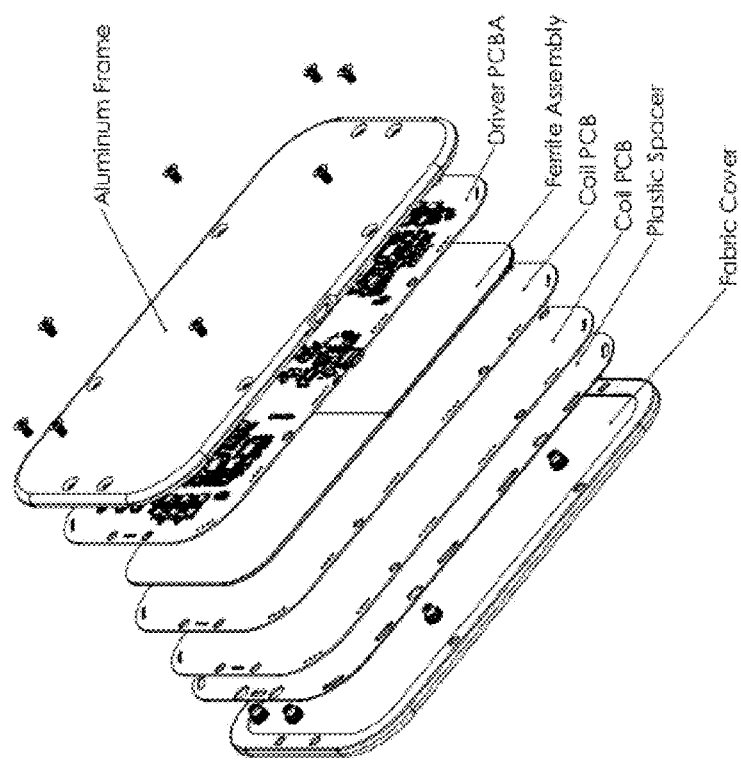
FIG. 21 illustrates an example of a charging device manufactured in accordance with certain aspects disclosed herein.
Figure 21:
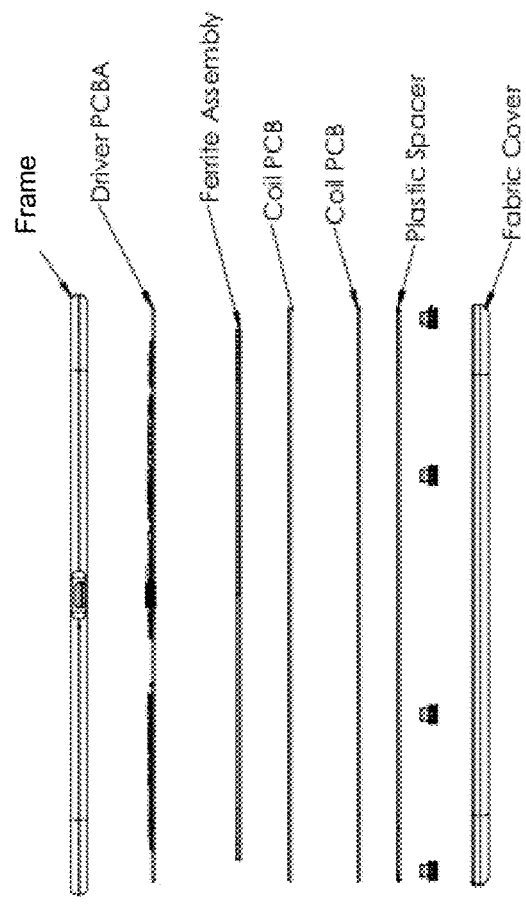

FIG. 21 illustrates an example of a charging device 2100 manufactured in accordance with certain aspects disclosed herein.

Figure 22:
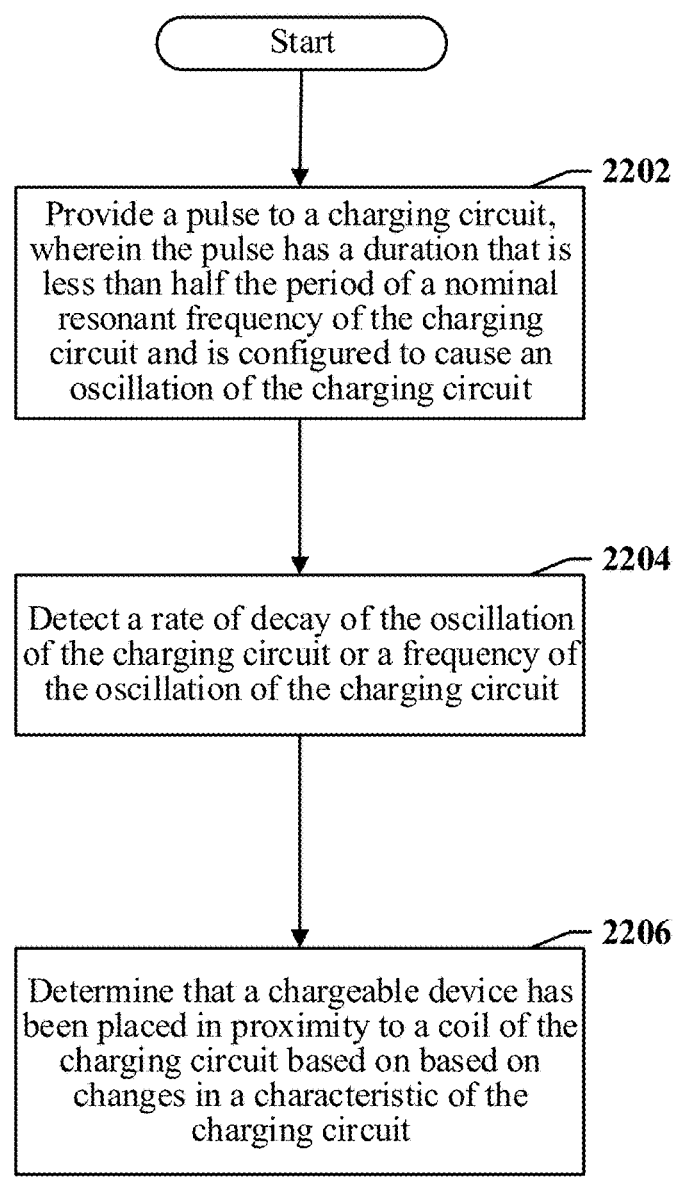
FIG. 22 is a flowchart illustrating an example of a method for detecting an object performed by a controller provided in a wireless charging apparatus adapted in accordance with certain aspects disclosed herein.

FIG. 22 is a flowchart 2200 illustrating one example of a method for detecting an object. The method may be performed by a controller provided in a wireless charging apparatus. At block 2202, the controller may provide a pulse to a charging circuit. The pulse may have a duration that is less than half the period of a nominal resonant frequency of the charging circuit and is configured to cause an oscillation of the charging circuit. In certain examples, the duration of the pulse may be less than half the period of a nominal resonant frequency of the charging circuit. At block 2204, the controller may detect a rate of decay of the oscillation of the charging circuit or a frequency of the oscillation of the charging circuit. At block 2206, the controller may determine that a chargeable device has been placed in proximity to a coil of the charging circuit based on changes of characteristics of the charging circuit. In one example the chargeable device modifies the rate of decay of the oscillation of the charging circuit. In another example, the chargeable device causes the frequency of oscillation of the charging circuit to vary with respect to the resonant frequency of the charging circuit.

In certain implementations, the controller may determine a charging configuration for the chargeable device when the coil of the charging circuit is inductively coupled to a receiving coil in the chargeable device, and provide a charging current to the charging circuit in accordance with the charging configuration. Determining the charging configuration for the chargeable device may include selecting a baseline charging configuration as the charging configuration. Determining the charging configuration for the chargeable device may include transmitting an active ping in accordance with standards-defined specifications for charging the chargeable device, identifying the chargeable device from information encoded in a modulated signal received from the chargeable device. Determining the charging configuration for the chargeable device may include negotiating the charging configuration with the chargeable device to provide an extended power profile used while charging the chargeable device.

In some implementations, the controller may conduct a low-power search of a plurality of charging coils to determine if an electrical, mechanical or magnetic characteristic of at least one charging coil has been affected by an object placed in proximity to the at least one charging coil, and configure the charging circuit to include the at least one charging coil.

In some implementations, the controller may detect that a change in capacitance associated with at least one charging coil is indicative of an object placed in proximity to the at least one charging coil, and configure the charging circuit to include the at least one charging coil.

Example of a Processing Circuit

Figure 23:
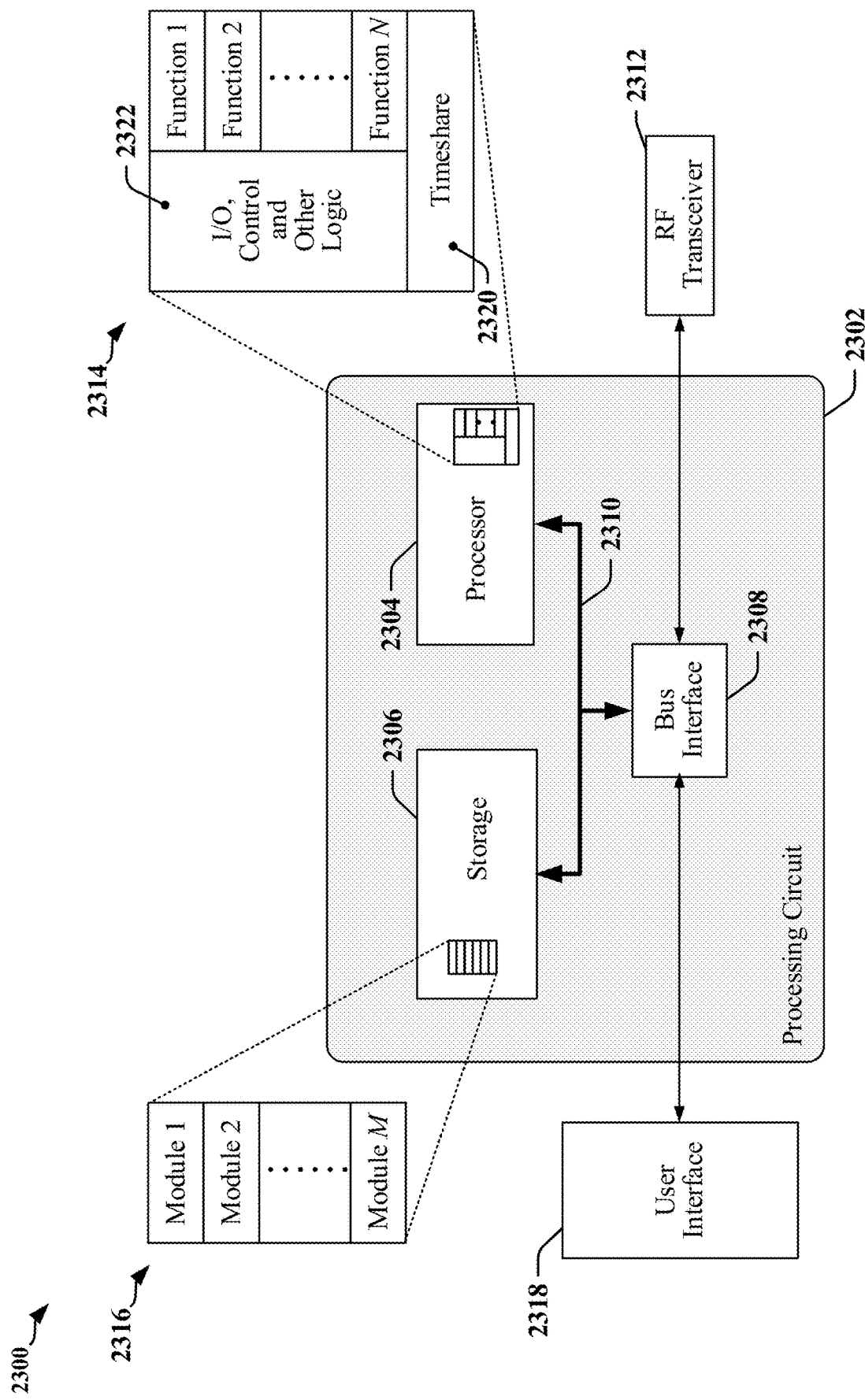
FIG. 23 illustrates one example of an apparatus employing a processing circuit that may be adapted according to certain aspects disclosed herein.

FIG. 23 is a diagram illustrating an example of a hardware implementation for an apparatus 2300 that may be incorporated in a charging device or in a receiving device that enables a battery to be wirelessly charged. In some examples, the apparatus 2300 may perform one or more functions disclosed herein. In accordance with various aspects of the disclosure, an element, or any portion of an element, or any combination of elements as disclosed herein may be implemented using a processing circuit 2302. The processing circuit 2302 may include one or more processors 2304 that are controlled by some combination of hardware and software modules. Examples of processors 2304 include microprocessors, microcontrollers, digital signal processors (DSPs), SoCs, ASICs, field programmable gate arrays (FPGAs), programmable logic devices (PLDs), state machines, sequencers, gated logic, discrete hardware circuits, and other suitable hardware configured to perform the various functionality described throughout this disclosure. The one or more processors 2304 may include specialized processors that perform specific functions, and that may be configured, augmented or controlled by one of the software modules 2316. The one or more processors 2304 may be configured through a combination of software modules 2316 loaded during initialization, and further configured by loading or unloading one or more software modules 2316 during operation.

In the illustrated example, the processing circuit 2302 may be implemented with a bus architecture, represented generally by the bus 2310. The bus 2310 may include any number of interconnecting buses and bridges depending on the specific application of the processing circuit 2302 and the overall design constraints. The bus 2310 links together various circuits including the one or more processors 2304, and storage 2306. Storage 2306 may include memory devices and mass storage devices, and may be referred to herein as computer-readable media and/or processor-readable media. The storage 2306 may include transitory storage media and/or non-transitory storage media.

The bus 2310 may also link various other circuits such as timing sources, timers, peripherals, voltage regulators, and power management circuits. A bus interface 2308 may provide an interface between the bus 2310 and one or more transceivers 2312. In one example, a transceiver 2312 may be provided to enable the apparatus 2300 to communicate with a charging or receiving device in accordance with a standards-defined protocol. Depending upon the nature of the apparatus 2300, a user interface 2318 (e.g., keypad, display, speaker, microphone, joystick) may also be provided, and may be communicatively coupled to the bus 2310 directly or through the bus interface 2308.

A processor 2304 may be responsible for managing the bus 2310 and for general processing that may include the execution of software stored in a computer-readable medium that may include the storage 2306. In this respect, the processing circuit 2302, including the processor 2304, may be used to implement any of the methods, functions and techniques disclosed herein. The storage 2306 may be used for storing data that is manipulated by the processor 2304 when executing software, and the software may be configured to implement any one of the methods disclosed herein.

One or more processors 2304 in the processing circuit 2302 may execute software. Software shall be construed broadly to mean instructions, instruction sets, code, code segments, program code, programs, subprograms, software modules, applications, software applications, software packages, routines, subroutines, objects, executables, threads of execution, procedures, functions, algorithms, etc., whether referred to as software, firmware, middleware, microcode, hardware description language, or otherwise. The software may reside in computer-readable form in the storage 2306 or in an external computer-readable medium. The external computer-readable medium and/or storage 2306 may include a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a "flash drive," a card, a stick, or a key drive), RAM, ROM, a programmable read-only memory (PROM), an erasable PROM (EPROM) including EEPROM, a register, a removable disk, and any other suitable medium for storing software and/or instructions that may be accessed and read by a computer. The computer-readable medium and/or storage 2306 may also include, by way of example, a carrier wave, a transmission line, and any other suitable medium for transmitting software and/or instructions that may be accessed and read by a computer. Computer-readable medium and/or the storage 2306 may reside in the processing circuit 2302, in the processor 2304, external to the processing circuit 2302, or be distributed across multiple entities including the processing circuit 2302. The computer-readable medium and/or storage 2306 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The storage 2306 may maintain software maintained and/or organized in loadable code segments, modules, applications, programs, etc., which may be referred to herein as software modules 2316. Each of the software modules 2316 may include instructions and data that, when installed or loaded on the processing circuit 2302 and executed by the one or more processors 2304, contribute to a run-time image 2314 that controls the operation of the one or more processors 2304. When executed, certain instructions may cause the processing circuit 2302 to perform functions in accordance with certain methods, algorithms and processes described herein.

Some of the software modules 2316 may be loaded during initialization of the processing circuit 2302, and these software modules 2316 may configure the processing circuit 2302 to enable performance of the various functions disclosed herein. For example, some software modules 2316 may configure internal devices and/or logic circuits 2322 of the processor 2304, and may manage access to external devices such as a transceiver 2312, the bus interface 2308, the user interface 2318, timers, mathematical coprocessors, and so on. The software modules 2316 may include a control program and/or an operating system that interacts with interrupt handlers and device drivers, and that controls access to various resources provided by the processing circuit 2302. The resources may include memory, processing time, access to a transceiver 2312, the user interface 2318, and so on.

One or more processors 2304 of the processing circuit 2302 may be multifunctional, whereby some of the software modules 2316 are loaded and configured to perform different functions or different instances of the same function. The one or more processors 2304 may additionally be adapted to manage background tasks initiated in response to inputs from the user interface 2318, the transceiver 2312, and device drivers, for example. To support the performance of multiple functions, the one or more processors 2304 may be configured to provide a multitasking environment, whereby each of a plurality of functions is implemented as a set of tasks serviced by the one or more processors 2304 as needed or desired. In one example, the multitasking environment may be implemented using a timesharing program 2320 that passes control of a processor 2304 between different tasks, whereby each task returns control of the one or more processors 2304 to the timesharing program 2320 upon completion of any outstanding operations and/or in response to an input such as an interrupt. When a task has control of the one or more processors 2304, the processing circuit is effectively specialized for the purposes addressed by the function associated with the controlling task. The timesharing program 2320 may include an operating system, a main loop that transfers control on a round-robin basis, a function that allocates control of the one or more processors 2304 in accordance with a prioritization of the functions, and/or an interrupt driven main loop that responds to external events by providing control of the one or more processors 2304 to a handling function.

In one implementation, the apparatus 2300 includes or operates as a wireless charging apparatus that has a battery charging power source coupled to a charging circuit, a plurality of charging cells and a controller, which may be included in one or more processors 2304. The plurality of charging cells may be configured to provide a charging surface. At least one coil may be configured to direct an electromagnetic field through a charge transfer area of each charging cell.

The controller may be configured to provide a pulse to the charging circuit, detect a frequency of oscillation of the charging circuit responsive to the pulse or a rate of decay of the oscillation of the charging circuit, and determine that a chargeable device has been placed in proximity to a coil of the charging circuit based on changes in a characteristic of the charging circuit. The pulse may have a duration that is less than half the period of a nominal resonant frequency of the charging circuit.

In one example, the change in the characteristic of the charging circuit causes a change in rate of decay of the oscillation of the charging circuit. In one example, the change in the characteristic of the charging circuit causes a change in the frequency of oscillation of the charging circuit to vary with respect to the resonant frequency of the charging circuit.

In certain examples, the controller is configured to determine a charging configuration for the chargeable device when a coil of the charging circuit is inductively coupled to a receiving coil in the chargeable device and provide a charging current to the charging circuit in accordance with the charging configuration. The controller may be configured to select a baseline charging configuration as the charging configuration. The controller may be configured to transmit an active ping in accordance with standards-defined specifications for charging the chargeable device and identify the chargeable device from information encoded in a modulated signal received from the chargeable device. The controller may be configured to negotiate the charging configuration with the chargeable device to provide an extended power profile used while charging the chargeable device.

In one example, the controller may be configured to conduct a low-power search of the charging surface to determine if an electrical, mechanical or magnetic characteristic of at least one charging cell has been affected by an object placed in proximity to the at least one charging cell and configure the charging circuit to include the at least one charging cell.

In one example, the controller may be configured to detect that a change in capacitance associated with at least one charging cell is indicative of an object placed in proximity to the at least one charging cell and configure the charging circuit to include the at least one charging cell.

In various examples, the apparatus 2300 may have a first printed circuit board having a top metal layer and a bottom metal layer, where a first portion of the plurality of charging cells is provided on the top metal layer of the first printed circuit board and a second portion of the plurality of charging cells is provided on the bottom metal layer of the first printed circuit board. The apparatus 2300 may have a second printed circuit board having a top metal layer and a bottom metal layer, where a third portion of the plurality of charging cells is provided on the top metal layer of the second printed circuit board and a fourth portion of the plurality of charging cells is provided on the bottom metal layer of the second printed circuit board. An adhesive layer may be used to join the first printed circuit board and the second printed circuit board such that the bottom metal layer of the first printed circuit board is adjacent to the top metal layer of the second printed circuit board. One or more interconnects may be provided between the bottom metal layer of the first printed circuit board and the top metal layer of the second printed circuit board.

In another implementation, the storage 2306 maintains instructions and information where the instructions are configured to cause the one or more processors 2304 to provide a pulse to a charging circuit, detect a rate of decay of oscillation of the charging circuit or a frequency of the oscillation of the charging circuit responsive to the pulse, and determine that a chargeable device has been placed in proximity to a coil of the charging circuit based on changes in a characteristic of the charging circuit. The pulse may have a duration that is less than half the period of a nominal resonant frequency of the charging circuit.

In one example, the change in the characteristic of the charging circuit may cause a change in rate of decay of the oscillation of the charging circuit. In one example, the change in the characteristic of the charging circuit may cause the frequency of oscillation of the charging circuit to vary with respect to the resonant frequency of the charging circuit.

In various examples, the instructions may be configured to cause the one or more processors 2304 to determine a charging configuration for the chargeable device when the coil of the charging circuit is inductively coupled to a receiving coil in the chargeable device, and provide a charging current to the charging circuit in accordance with the charging configuration. The charging configuration for the chargeable device may be determined by selecting a baseline charging configuration as the charging configuration. The charging configuration for the chargeable device may be determined by transmitting an active ping in accordance with standards-defined specifications for charging the chargeable device and identifying the chargeable device from information encoded in a modulated signal received from the chargeable device. The charging configuration for the chargeable device may be determined by negotiating the charging configuration with the chargeable device to provide an extended power profile used while charging the chargeable device.

In one example, the instructions may be configured to cause the one or more processors 2304 to conduct a low-power search of a plurality of charging coils to determine if an electrical, mechanical or magnetic characteristic of at least one charging coil has been affected by an object placed in proximity to the at least one charging coil, and configure the charging circuit to include the at least one charging coil.

In one example, the instructions may be configured to cause the one or more processors 2304 to detect that a change in capacitance associated with at least one charging coil is indicative of an object placed in proximity to the at least one charging coil, and configure the charging circuit to include the at least one charging coil.

In another implementation, the apparatus 2300 includes or operates as charging device. The charging device may have a first printed circuit board having a top metal layer and a bottom metal layer, where a first plurality of charging cells is provided on the top metal layer of the first printed circuit board and a second plurality of charging cells is provided on the bottom metal layer of the first printed circuit board. The charging device may have a second printed circuit board having a top metal layer and a bottom metal layer, where a third plurality of charging cells is provided on the top metal layer of the second printed circuit board and a fourth plurality of charging cells is provided on the bottom metal layer of the second printed circuit board. An adhesive layer may join the first printed circuit board and the second printed circuit board such that the bottom metal layer of the first printed circuit board is adjacent to the top metal layer of the second printed circuit board. One or more interconnects may be provided between the bottom metal layer of the first printed circuit board and the top metal layer of the second printed circuit board. In some instances, each charging cell in the first plurality of charging cells, the second plurality of charging cells, the third plurality of charging cells and the fourth plurality of charging cells may be energized independently of the other charging cells provided in the charging device.

In one example, at least one of the first printed circuit board and the second printed circuit board has one or more internal metal layers provided between the top metal layer and the bottom metal layer. Additional charging cells may be provided on the one or more internal metal layers.

In certain examples, the first printed circuit board and the second printed circuit board present a charging surface to a device to be charged. Each charging cell in the first plurality of charging cells, the second plurality of charging cells, the third plurality of charging cells and the fourth plurality of charging cells may have a coil that surrounds a portion of power transfer area associated with the charging surface. The charging surface may correspond to the top metal layer of the first printed circuit board. A set of switches may be operable to selectively couple at least one charging cell in the charging device to a power source and a controller configured to select the at least one charging cell based on an orientation or location of the device to be charged with respect to the charging surface. A detection circuit may be coupled to charging cells on at least one layer of at least one printed circuit board, the detection circuit being configured to detect differences in capacitance associated with two or more charging cells.

The controller may be further configured to select the at least one charging cell based on the differences in capacitance. The controller may be further configured to select polarity and level of a current provided to the at least one charging cell based on the differences in capacitance. The controller may be further configured to determine a change in the differences in capacitance associated with the two or more charging cells and modify the polarity or the level of the current provided to the at least one charging cell based on the change in differences in capacitance. The controller may be further configured to determine orientation or location of the device to be charged based on the differences in capacitance. The controller may be further configured to periodically search for the device to be charged by determining capacitance measured at each charging cell in a sequence of charging cells. The sequence of charging cells may be generated pseudorandomly between consecutive searches. The controller may be further configured to select a starting point for the device to be charged.

In one example, at least one interconnect does not penetrate the top metal layer of the first printed circuit board. In one example, at least one interconnect does not penetrate the bottom metal layer of the second printed circuit board. In one example, the adhesive layer includes openings through which at least one interconnect passes between the first printed circuit board and the second printed circuit board. In one example, each of the first printed circuit board and the second printed circuit board has a flexible printed circuit board. In one example, each of the first printed circuit board and the second printed circuit board has a non-planar printed circuit board.

In another implementation, the apparatus 2300 has a flexible circuit that includes a plurality of coils configured to present a power transfer area along at least two axes when the flexible circuit is mounted on a battery and a power management circuit electrically coupled to the battery. The power management circuit may be configured or adapted to determine charge level of the battery, receive power transferred wirelessly from a wireless charging source, and provide a charging current to the battery when the charge level of the battery is below a maximum threshold charge level and the wireless charging source is transferring power through one or more of the plurality of coils.

In one example, at least two axes include a pair of orthogonal axes on a surface of the battery. The flexible circuit may envelop at least a portion of the battery. In one example, the flexible circuit includes a sheet material configured to provide electromagnetic shielding. The sheet material may be positioned between the plurality of coils and the battery when the flexible circuit is wrapped around the battery. In one example, the plurality of coils is formed in at least four metal layers of the flexible circuit.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:

1. A method for detecting an object, comprising:
   searching a charging surface of a wireless charging device, including:
      providing pulses to a plurality of power transmitting coils in the charging surface, wherein each pulse has a duration that is less than half a period of a nominal resonant frequency of the charging circuit, and wherein each pulse is configured to cause an oscillation of a charging circuit coupled to one or more of the plurality of power transmitting coils;
      determining a rate of decay of the oscillation of the charging circuit or a frequency of the oscillation of the charging circuit; and
      determining whether one or more of the plurality of power transmitting coils is/are proximate to one or more chargeable devices based on the rate of decay of the oscillation or the change in the frequency of the oscillation of a corresponding charging circuit;
   transmitting digital pings to one or more of the plurality of power transmitting coils in accordance with standards-defined specifications for wireless charging when the one or more power transmitting coils are determined to be proximate to the one or more chargeable devices during the searching of the charging surface; and determining a charging configuration for the one or more chargeable devices based on information encoded in a modulated signal received from the one or more chargeable devices in response to the digital pings sent to the one or more chargeable devices.

2. The method of claim 1, wherein a first power transmitting coil is determined to be proximate to a chargeable device when a rate of decay of oscillation in the first power transmitting coil during the searching of the charging surface is different from a previously determined rate of decay of oscillation in the first power transmitting coil.

3. The method of claim 1, wherein a second power transmitting coil is determined to be proximate to a chargeable device when frequency of oscillation in the second power transmitting coil during the searching of the charging surface is different from a previously determined frequency of oscillation in the second power transmitting coil.

4. The method of claim 1, further comprising:
determining the charging configuration when two power transmitting coils are determined to be proximate to the one or more chargeable devices; and
providing charging currents to the first power transmitting coil and the second power transmitting coil in accordance with the charging configuration.

5. The method of claim 1, wherein determining the charging configuration for the one or more chargeable devices comprises:
selecting a baseline charging configuration as the charging configuration.

6. The method of claim 1, wherein determining the charging configuration for the one or more chargeable devices comprises:
negotiating the charging configuration with the one or more chargeable devices to provide an extended power profile to be used while charging the one or more chargeable devices.

7. The method of claim 1, further comprising:
conducting a low-power search of the charging surface to determine if an electrical, mechanical or magnetic characteristic of at least one power transmitting coil has been affected by an object placed in proximity to the at least one power transmitting coil; and
including the at least one power transmitting coil in the plurality of power transmitting coils that is provided pulses when searching the charging surface.

8. The method of claim 1, further comprising:
detecting a change in capacitance associated with at least one power transmitting coil that is indicative of an object placed in proximity to the at least one power transmitting coil; and
including the at least one power transmitting coil in the plurality of power transmitting coils provided pulses when searching the charging surface.

9. A wireless charging apparatus, comprising:
a battery charging power source coupled to a charging circuit;
a plurality of charging cells configured to provide a charging surface, wherein one or more power transmitting coils in the charging surface are configured to direct an electromagnetic field through a charge transfer area of each charging cell; and
a controller configured to:
search a charging surface of a wireless charging device, by:
providing pulses to the one or more power transmitting coils in the charging surface, wherein each pulse has a duration that is less than half a period of a nominal resonant frequency of the charging circuit, and wherein each pulse is configured to cause an oscillation of a charging circuit coupled to the one or more power transmitting coils;
determining a rate of decay of the oscillation of the charging circuit or a frequency of the oscillation of the charging circuit; and
determining whether each of the one or more power transmitting coils is proximate to one or more chargeable devices based on the rate of decay of the oscillation or the change in the frequency of the oscillation of a corresponding charging circuit;
transmit digital pings to one or more of the one or more power transmitting coils in accordance with standards-defined specifications for wireless charging when the one or more power transmitting coils are determined to be proximate to the one or more chargeable devices during the searching of the charging surface; and
determine a charging configuration for the one or more chargeable devices based on information encoded in a modulated signal received from the one or more chargeable devices in response to the digital pings sent to the one or more chargeable devices.

10. The wireless charging apparatus of claim 9, wherein a first power transmitting coil is determined to be proximate to a chargeable device when a rate of decay of oscillation in the first power transmitting coil during the searching of the charging surface is different from a previously determined rate of decay of oscillation in the first power transmitting coil.

11. The wireless charging apparatus of claim 9, wherein a second power transmitting coil is determined to be proximate to a chargeable device when frequency of oscillation in the second power transmitting coil during the searching of the charging surface is different from a previously determined frequency of oscillation in the second power transmitting coil.

12. The wireless charging apparatus of claim 9, wherein the controller is configured to:
determine the charging configuration when two power transmitting coils are determined to be proximate to the at least one chargeable device; and
provide charging currents to the first power transmitting coil and the second power transmitting coil in accordance with the charging configuration.

13. The wireless charging apparatus of claim 9, wherein the controller is configured to:
select a baseline charging configuration as the charging configuration.

14. The wireless charging apparatus of claim 9, wherein the controller is configured to:
negotiate the charging configuration with the one or more chargeable devices to provide an extended power profile to be used while charging the one or more chargeable devices.

15. The wireless charging apparatus of claim 9, wherein the controller is configured to:
conduct a low-power search of the charging surface to determine if an electrical, mechanical or magnetic characteristic of at least one power transmitting coil has been affected by an object placed in proximity to the at least one charging cell; and
include the at least one power transmitting coil in the plurality of power transmitting coils that is provided pulses when searching the charging surface.

16. The wireless charging apparatus of claim 9, wherein the controller is configured to:
- detect a change in capacitance associated with at least one power transmitting coil is indicative of an object placed in proximity to the at least one power transmitting coil; and
- include the at least one power transmitting coil in the plurality of power transmitting coils provided pulses when searching the charging surface.

17. The wireless charging apparatus of claim 9, further comprising:
- a first printed circuit board having a top metal layer and a bottom metal layer, wherein a first portion of the plurality of charging cells is provided on the top metal layer of the first printed circuit board and a second portion of the plurality of charging cells is provided on the bottom metal layer of the first printed circuit board;
- a second printed circuit board having a top metal layer and a bottom metal layer, wherein a third portion of the plurality of charging cells is provided on the top metal layer of the second printed circuit board and a fourth portion of the plurality of charging cells is provided on the bottom metal layer of the second printed circuit board; and
- an adhesive layer joining the first printed circuit board and the second printed circuit board such that the bottom metal layer of the first printed circuit board is adjacent to the top metal layer of the second printed circuit board.

18. The wireless charging apparatus of claim 17, further comprising:
- one or more interconnects provided between the bottom metal layer of the first printed circuit board and the top metal layer of the second printed circuit board.

19. A method for identifying a chargeable device, comprising:
- providing a first pulse to a first charging coil, wherein the first charging coil is one of a plurality of charging coils arranged across a charging surface, and wherein the first pulse is configured to cause oscillation of a first charging circuit that includes the first charging coil;
- providing a second pulse to a second charging coil, wherein the second charging coil is one of the plurality of charging coils arranged across the charging surface, and wherein the second pulse is configured to cause oscillation of a second charging circuit that includes the second charging coil;
- determining responses of the first charging circuit and the second charging circuit to the first pulse and the second pulse, respectively, wherein the responses relate to rate of decay of oscillation or frequency of oscillation;
- using the responses to select between the first charging coil and the second charging coil to serve as a transmitting coil when the responses indicate that a chargeable device has been placed proximate to the first charging coil or the second charging coil; and
- transmitting an active ping through the transmitting coil, wherein the first pulse and the second pulse have a duration that is less than half a period of a nominal resonant frequency associated with the first charging circuit or the second charging circuit.

20. The method of claim 19, further comprising:
- sequentially measuring capacitance associated with each of a plurality of charging coils that includes the first charging coil and the second charging coil, wherein sequential order of capacitance measurement is based on a pseudo-random search pattern initiated from a starting point based on a history of capacitance measurements; and
- detecting a change in capacitance associated with the first charging coil or the second charging coil, wherein the change in capacitance is indicative of an object placed in proximity to the charging surface, and wherein the first pulse and the second pulse are transmitted based on detection of the change in capacitance associated with the first charging coil or the second charging coil.

21. The method of claim 19, further comprising:
- configuring the chargeable device based on a response of the chargeable device to the active ping.

22. The method of claim 19, wherein configuring the chargeable device comprises:
- determining a charging configuration for the chargeable based on information encoded in a modulated signal received from the chargeable device in response to the active ping; and
- providing a charging current to the charging circuit in accordance with the charging configuration.

23. The method of claim 22, wherein determining the charging configuration for the chargeable device comprises:
- selecting a baseline charging configuration as the charging configuration.

24. The method of claim 22, wherein determining the charging configuration for the chargeable device comprises:
- negotiating the charging configuration with the chargeable device to provide an extended power profile used while charging the chargeable device.

* * * * *